US010629462B2

(12) United States Patent
Togashi et al.

(10) Patent No.: US 10,629,462 B2
(45) Date of Patent: Apr. 21, 2020

(54) WAFER PROCESSING SYSTEM

(71) Applicant: DISCO CORPORATION, Tokyo (JP)

(72) Inventors: Ken Togashi, Tokyo (JP); Masahiro Tsukamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 309 days.

(21) Appl. No.: 15/617,110

(22) Filed: Jun. 8, 2017

(65) Prior Publication Data

US 2017/0358465 A1    Dec. 14, 2017

(30) Foreign Application Priority Data

Jun. 8, 2016 (JP) .................................. 2016-114439

(51) Int. Cl.
*G06F 19/00* (2018.01)
*H01L 21/67* (2006.01)
*H01L 21/677* (2006.01)
*G05B 19/27* (2006.01)

(52) U.S. Cl.
CPC .......... *H01L 21/6719* (2013.01); *G05B 19/27* (2013.01); *H01L 21/6773* (2013.01); *H01L 21/67092* (2013.01); *H01L 21/67132* (2013.01); *H01L 21/67219* (2013.01); *H01L 21/67282* (2013.01); *H01L 21/67745* (2013.01); *G05B 2219/2627* (2013.01); *G05B 2219/40623* (2013.01); *G05B 2219/45031* (2013.01)

(58) Field of Classification Search
CPC ............ G05B 19/27; G05B 2219/2627; G05B 2219/40623; G05B 2219/45031; H01L 21/67092; H01L 21/6712; H01L 21/6719; H01L 21/67219; H01L 21/67282; H01L 21/6773; H01L 21/67745
See application file for complete search history.

(56) References Cited

U.S. PATENT DOCUMENTS

| 2003/0129809 A1* | 7/2003 | Takyu ..................... H01L 21/78 438/460 |
| 2006/0102078 A1* | 5/2006 | Fairbairn .......... H01L 21/67161 118/719 |

(Continued)

FOREIGN PATENT DOCUMENTS

| JP | 2011-091293 | 5/2011 |
| JP | 2013-214601 | 10/2013 |

*Primary Examiner* — Zhipeng Wang
(74) *Attorney, Agent, or Firm* — Greer Burns & Crain Ltd.

(57) ABSTRACT

A wafer processing system includes a laser processing apparatus, a grinding apparatus, a tape sticking apparatus, a first cassette placement part, a second cassette placement part, a conveying unit that conveys a wafer, and a controller that controls the respective constituent elements. The controller includes a first processing program instructing section that conveys a wafer unloaded from a first cassette in order of the laser processing apparatus, the grinding apparatus, the tape sticking apparatus, and a second cassette and sequentially carries out processing by each apparatus for the one wafer, and a second processing program instructing section that conveys the wafer unloaded from the first cassette in order of the grinding apparatus, the laser processing apparatus, the tape sticking apparatus, and the second cassette and sequentially carries out processing by each apparatus for the one wafer.

7 Claims, 14 Drawing Sheets

(56) References Cited

U.S. PATENT DOCUMENTS

2009/0028671 A1\* 1/2009 Jin .................... H01L 21/67069
　　　　　　　　　　　　　　　　　　　　　414/217
2015/0357242 A1\* 12/2015 Nakamura .............. H01L 21/78
　　　　　　　　　　　　　　　　　　　　　438/462

\* cited by examiner

FIG.2
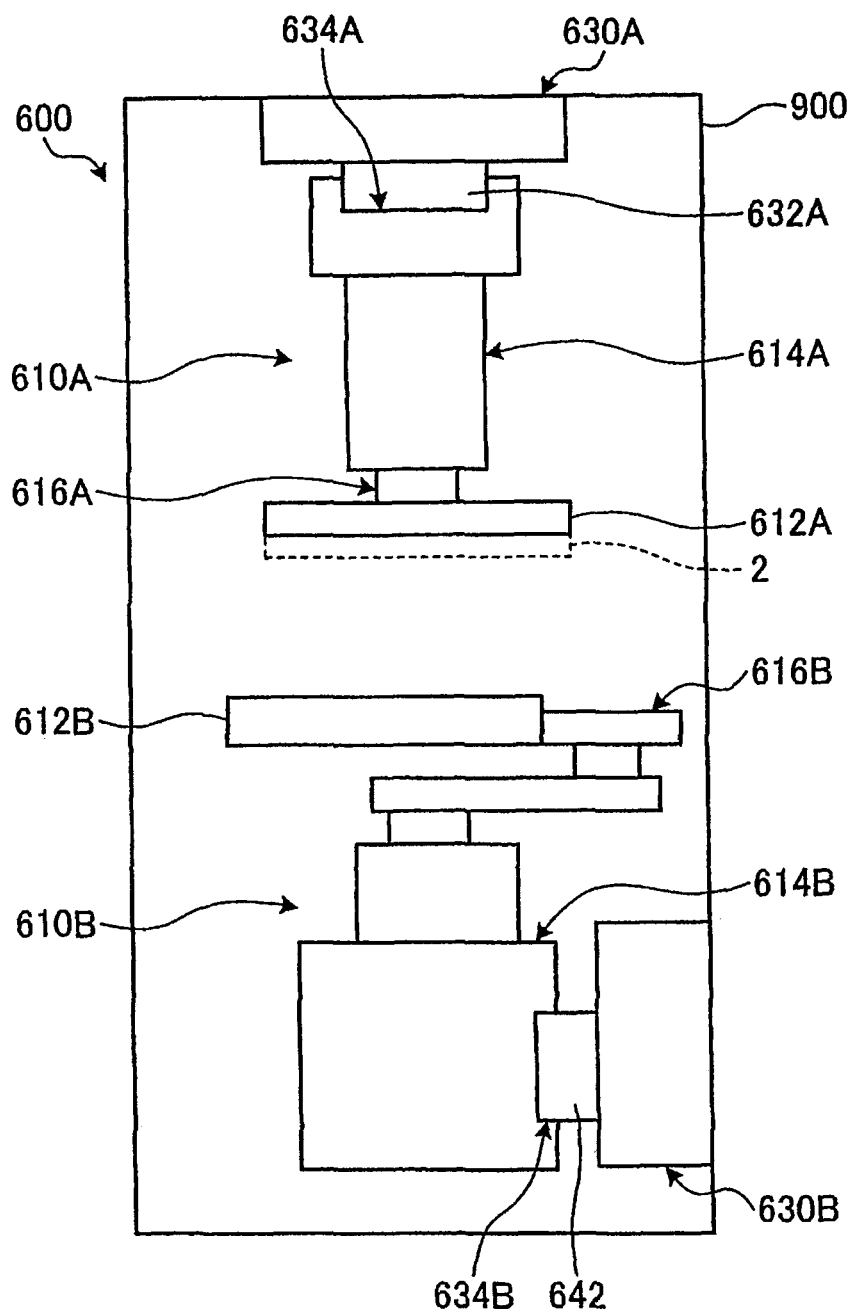
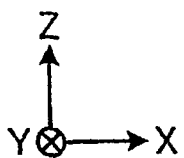

WAFER PROCESSING SYSTEM

BACKGROUND OF THE INVENTION

Field of the Invention

The present invention relates to a wafer processing system.

Description of the Related Art

As methods for processing a wafer having a front surface on which devices are formed in plural regions partitioned by planned dividing lines, grinding processing by a grinding apparatus, laser processing by a laser processing apparatus, tape shift-sticking processing by a tape sticking apparatus, and so forth are known (refer to Japanese Patent Laid-open No. 2011-091293).

In the case of dividing a wafer along planned dividing lines to manufacture plural device chips, treatment of thinning the wafer by grinding the back surface of the wafer by using the grinding apparatus, treatment of irradiating the wafer with a laser beam by using the laser processing apparatus, processing of sticking a dicing tape to the wafer by using the tape sticking apparatus, and so forth are carried out. The wafer thinned by the grinding apparatus is conveyed by an operator in the state of being housed in a cassette and is loaded into the laser processing apparatus. The wafer subjected to the laser processing by the laser processing apparatus is conveyed by an operator in the state of being housed in a cassette and is loaded into the tape sticking apparatus.

If the wafer is conveyed in the state of being housed in a cassette, there is a possibility that the wafer breaks in the conveyance. In particular, the wafer after the thinning or after the laser processing is in a very-fragile state and therefore the possibility of breaking in the conveyance is high. Furthermore, if the wafer is loaded into either one apparatus of the grinding apparatus, the laser processing apparatus, and the tape sticking apparatus by an operator in the state of being housed in a cassette, there is a possibility that the wafer is loaded into different apparatus accidentally.

Moreover, in recent years, stealth dicing before grinding (SDBG) obtained by applying stealth dicing processing to dicing before grinding (DBG) has begun to be employed (refer to Japanese Patent Laid-open No. 2013-214601). The DBG is a method in which a wafer is divided into plural device chips by grinding the back surface of the wafer after forming grooves in the front surface of the wafer along planned dividing lines. In the DBG, the grooves are formed before the wafer is thinned. For this reason, according to the DBG, back surface chipping is suppressed and the bending strength of the device chips is improved compared with a method in which grooves are formed after a wafer is thinned. The SDBG is a method in which a wafer is divided into plural device chips as follows. Specifically, the wafer is irradiated with a laser beam along planned dividing lines to form modified layers inside the wafer. Thereafter, the back surface of the wafer is ground. Then, a dicing tape is stuck to the back surface of the wafer and is expanded.

SUMMARY OF THE INVENTION

The SDBG can improve the bending strength of the device chips similarly to the DBG. Furthermore, the SDBG has merits that the kerf width can be suppressed compared with the DBG and a sufficient number of obtained device chips can be ensured.

On the other hand, the wafer in which the modified layers have been formed by the SDBG is in a fragile state. For this reason, when the wafer in which the modified layers have been formed is conveyed among the laser processing apparatus, the grinding apparatus, and the tape sticking apparatus in the state of being housed in a cassette, the possibility of breaking due to vibration or the like is high. Furthermore, in the SDBG, the interval between devices adjacent to each other is small compared with the DBG. For this reason, if the wafer breaks along modified layers to be divided into device chips in the conveyance of the wafer, this causes the lowering of the quality of the manufactured device chips, such as the occurrence of chipping in devices due to rubbing of the device chips against each other and the lowering of the bending strength of the device chips.

Thus, an object of the present invention is to provide a wafer processing system that can suppress breaking of a wafer and suppress the lowering of the quality of manufactured device chips when the wafer is conveyed among laser processing apparatus, grinding apparatus, and tape sticking apparatus.

In accordance with an aspect of the present invention, there is provided a wafer processing system that executes processing for a wafer having a front surface on which a device is formed in each of a plurality of regions partitioned by a plurality of planned dividing lines that intersect. The wafer processing system includes a laser processing apparatus including a laser beam irradiation unit that irradiates the wafer with a laser beam to form modified layers inside the wafer along the planned dividing lines, a grinding apparatus including a grinding unit that grinds a back surface of the wafer to thin the wafer, and a tape sticking apparatus including frame-unit forming means for sticking a dicing tape to the back surface of the wafer ground by the grinding apparatus and fixing an annular frame to an outer circumferential edge of the dicing tape and separating means for separating a protective tape stuck to the front surface of the wafer. The wafer processing system further includes a first cassette placement part at which a first cassette that houses a plurality of wafers each having the front surface to which the protective tape is stuck is placed, a second cassette placement part at which a second cassette that houses a plurality of wafers each supported in an opening of the annular frame by the dicing tape is placed, a conveying unit that conveys the wafer among the laser processing apparatus, the grinding apparatus, the tape sticking apparatus, the first cassette, and the second cassette, and control means for controlling the respective constituent elements. The control means includes a first processing program instructing section that conveys the wafer unloaded from the first cassette in order of the laser processing apparatus, the grinding apparatus, the tape sticking apparatus, and the second cassette and sequentially carries out processing by each apparatus for the one wafer, and a second processing program instructing section that conveys the wafer unloaded from the first cassette in order of the grinding apparatus, the laser processing apparatus, the tape sticking apparatus, and the second cassette and sequentially carries out processing by each apparatus for the one wafer.

In the wafer processing system according to the present invention, it is preferable that the control means include a third processing program instructing section that conveys the wafer unloaded from the first cassette in order of the grinding apparatus and the tape sticking apparatus and carries out processing by each apparatus for the one wafer, and a fourth processing program instructing section that conveys the wafer unloaded from the first cassette or the second cassette to the laser processing apparatus and carries out processing by the laser processing apparatus for the wafer and the third processing program and the fourth processing program be concurrently executed.

According to the present invention, a wafer processing system is provided that can suppress breaking of a wafer and suppress the lowering of the quality of manufactured device chips when the wafer is conveyed among a laser processing apparatus, a grinding apparatus, and a tape sticking apparatus.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 2 is a side view schematically showing one example of a conveying unit according to the embodiment;

DETAILED DESCRIPTION OF THE PREFERRED EMBODIMENT

An embodiment according to the present invention will be described below with reference to the drawings. However, the present invention is not limited thereto. Constituent elements of the embodiment to be described below can be combined as appropriate. Furthermore, part of the constituent elements is not used in some cases. In the following description, an XYZ orthogonal coordinate system will be set and the positional relationship among the respective parts will be described with reference to this XYZ orthogonal coordinate system. The direction parallel to the X-axis in a horizontal plane is defined as the X-axis direction and the direction parallel to the Y-axis orthogonal to the X-axis in the horizontal plane is defined as the Y-axis direction. The direction parallel to the Z-axis orthogonal to each of the X-axis and the Y-axis is defined as the Z-axis direction. The XY-plane including the X-axis and the Y-axis is parallel to the horizontal plane. The Z-axis direction orthogonal to the XY-plane is the vertical direction.

[Wafer Processing System]

Figure 1:
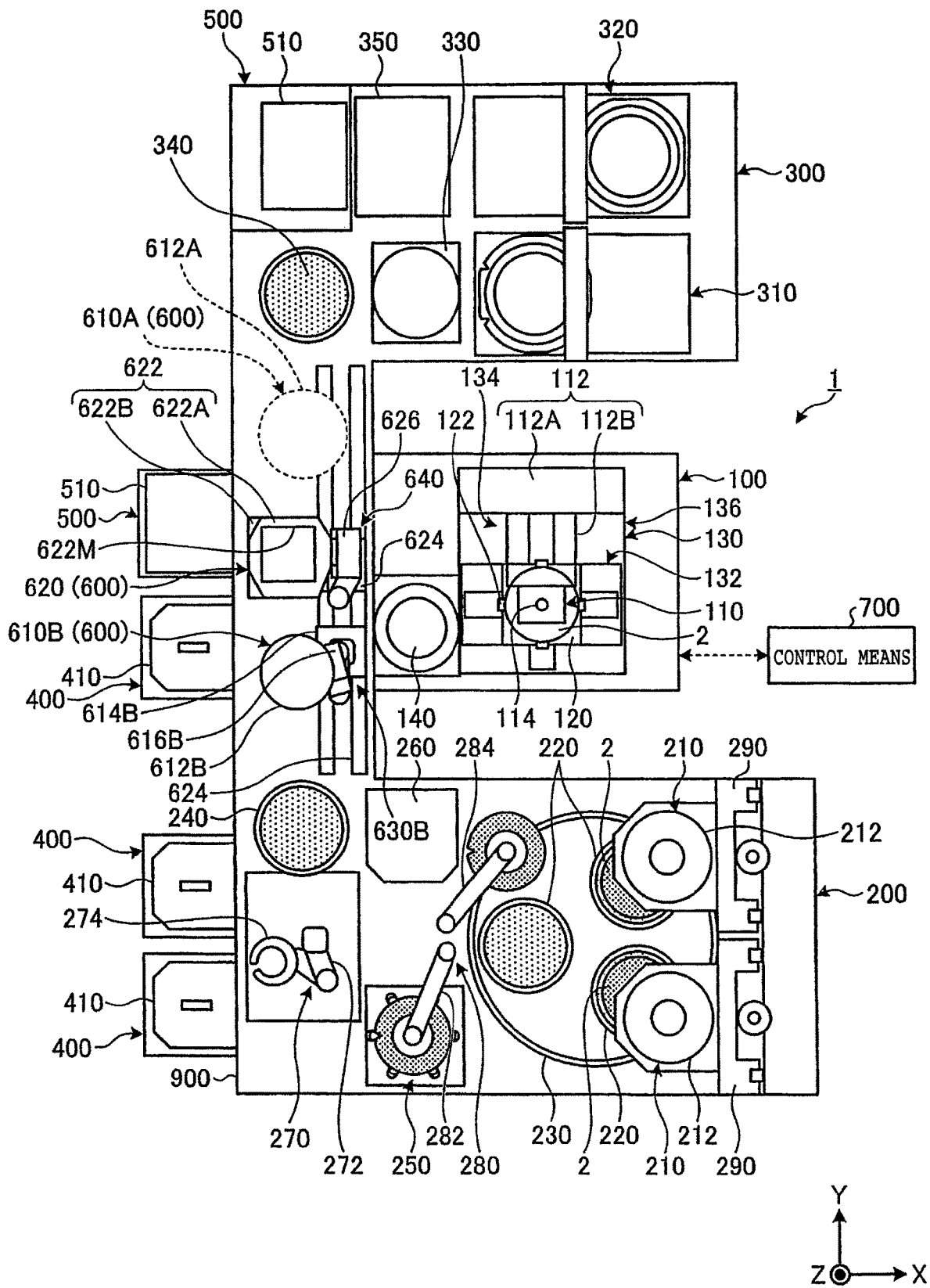
FIG. 1 is a schematic configuration diagram showing one example of a wafer processing system according to an embodiment of the present invention.

FIG. 1 is a schematic configuration diagram showing one example of a wafer processing system 1 according to the present embodiment. The wafer processing system 1 carries out processing for a wafer 2 having a front surface on which devices are formed in plural regions partitioned by plural planned dividing lines that intersect. The wafer processing system 1 includes the following constituent elements: a laser processing apparatus 100 including a laser beam irradiation unit 110 that irradiates the wafer 2 with a laser beam; a grinding apparatus 200 including grinding units 210 that grind the wafer 2; a tape sticking apparatus 300 including frame-unit forming means 310 and separating means 320; first cassette placement parts 400 at which first cassettes 410 that house plural wafers 2 to which protective tapes are stuck are placed; second cassette placement parts 500 at which second cassettes 510 that house plural wafers 2 each supported in an opening of an annular frame by a dicing tape are placed; a conveying unit 600 that conveys the wafers 2 among the laser processing apparatus 100, the grinding apparatus 200, the tape sticking apparatus 300, the first cassettes 410, and the second cassettes 510; and control means 700 for controlling the respective constituent elements of the wafer processing system 1.

(Laser Processing Apparatus)

The laser processing apparatus 100 has the laser beam irradiation unit 110, a chuck table 120 that detachably holds the wafer 2, a table moving apparatus 130 that moves the chuck table 120, and a provisional placement part 140 that temporarily holds the wafer 2.

The laser beam irradiation unit 110 irradiates the wafer 2 held by the chuck table 120 with a laser beam. The laser beam irradiation unit 110 irradiates the wafer 2 with the laser beam to form modified layers inside the wafer 2 along the planned dividing lines of the wafer 2. The laser beam irradiation unit 110 irradiates the wafer 2 with the laser beam having such a wavelength as to be transmitted through the wafer 2 to carry out stealth dicing processing for the wafer 2.

The laser beam irradiation unit 110 is supported by a support mechanism 112. The support mechanism 112 has a support column 112A and a support arm 112B that protrudes from the support column 112A in the −Y-direction. The laser beam irradiation unit 110 is fixed at the tip part of the support arm 112B. The laser beam irradiation unit 110 collects the laser beam generated by a laser oscillator by a lens 114 and radiates the laser beam to the wafer 2.

The chuck table 120 has a holding surface that detachably holds the wafer 2. The holding surface of the chuck table 120 is substantially parallel to the XY-plane. The chuck table 120 includes a vacuum chuck mechanism. Plural suction ports connected to a vacuum suction source are made in the holding surface of the chuck table 120. The vacuum suction source operates in the state in which the wafer 2 is placed on the holding surface of the chuck table 120, and thereby the wafer 2 is held by the chuck table 120 by suction. By stop of the operation of the vacuum suction source, the wafer 2 is released from the chuck table 120.

If a protective tape is stuck to the wafer 2, the chuck table 120 holds the wafer 2 with the intermediary of the protective tape. Furthermore, a clamp mechanism 122 is disposed surrounding the holding surface of the chuck table 120. If the wafer 2 is supported in an opening of an annular frame by a dicing tape, the annular frame is fixed by the clamp mechanism 122.

The table moving apparatus 130 moves the chuck table 120 in the X-axis direction and the Y-axis direction. The table moving apparatus 130 has a first stage 132 that movably supports the chuck table 120 in the X-axis direction, a second stage 134 that movably supports the first stage 132 in the Y-axis direction, and a base member 136 that supports the second stage 134. The first stage 132 has a guide member that guides the chuck table 120 in the X-axis direction and an actuator that generates power for moving the chuck table 120 in the X-axis direction. The second stage 134 has a guide member that guides the first stage 132 in the Y-axis direction and an actuator that generates power for moving the first stage 132 in the Y-axis direction.

The provisional placement part 140 temporarily holds the wafer 2 before being loaded onto the chuck table 120 or after being unloaded from the chuck table 120 and locates the wafer 2 at a predetermined position. The wafer 2 loaded into the laser processing apparatus 100 by the conveying unit 600 is placed at the provisional placement part 140 and then is loaded onto the chuck table 120. By operation of the table moving apparatus 130, the chuck table 120 that holds the wafer 2 is moved to the irradiation position of the laser beam emitted from the laser beam irradiation unit 110.

By the irradiation of the wafer 2 held by the chuck table 120 with the laser beam emitted from the laser beam irradiation unit 110, modified layers are formed inside the wafer 2. After the irradiation of the wafer 2 with the laser beam, the wafer 2 is unloaded from the chuck table 120. The wafer 2 unloaded from the chuck table 120 is placed at the provisional placement part 140 and then is unloaded from the laser processing apparatus 100 by the conveying unit 600.

(Grinding Apparatus)

The grinding apparatus 200 has the grinding units 210, chuck tables 220 that detachably hold the wafer 2, a turntable 230 that moves the chuck tables 220, a provisional placement part 240 that temporarily holds the wafer 2, a position adjustment unit 250 that adjusts the position of the wafer 2, a cleaning unit 260 that cleans the wafer 2, and a first conveying apparatus 270 and a second conveying apparatus 280 that convey the wafer 2.

The grinding unit 210 grinds the wafer 2 held by the chuck table 220. The grinding unit 210 grinds the back surface of the wafer 2 to thin the wafer 2. In the present embodiment, two grinding units 210 are provided.

The grinding unit 210 has a spindle housing 212, a spindle rotatably supported by the spindle housing, a grinding wheel that is provided at the lower end part of the spindle and can rotate around a grinding rotation axis parallel to the Z-axis, and an actuator that generates power for rotating the grinding wheel. Grinding stones are disposed on the lower surface of the grinding wheel. The grinding stones can be opposed to the back surface of the wafer 2 held by the chuck table 220. The spindle housing 212 is supported by a support mechanism 290. The support mechanism 290 movably supports the spindle housing 212 in the Z-axis direction.

The chuck table 220 includes a vacuum chuck mechanism and detachably holds the wafer 2. The holding surface of the chuck table 220 that holds the wafer 2 is substantially parallel to the XY-plane. The chuck table 220 can rotate around a table rotation axis parallel to the Z-axis by operation of the actuator.

The chuck table 220 holds the wafer 2 in such a manner that the holding surface of the chuck table 220 is opposed to the front surface of the wafer 2 and the back surface of the wafer 2 is oriented upward. If a protective tape is stuck to the front surface of the wafer 2, the chuck table 220 holds the wafer 2 with the intermediary of the protective tape. The chuck table 220 can move to a grinding position directly beneath the grinding unit 210. In the present embodiment, three chuck tables 220 are provided.

The turntable 230 supports the plural chuck tables 220. The turntable 230 intermittently rotates by a predetermined angle (for example 120 [°]) around a turntable rotation axis parallel to the Z-axis by operation of an actuator. Due to the rotation of the turntable 230, the chuck tables 220 supported by the turntable 230 move to grinding positions. In the present embodiment, the relative positions between the grinding units 210 and the chuck tables 220 are defined in such a manner that two chuck tables 220 out of the three chuck tables 220 are each disposed at a respective one of grinding positions directly beneath the two grinding units 210. Furthermore, in the state in which the two chuck tables 220 are disposed at the grinding positions, one chuck table 220 is disposed at a load/unload position at which loading and unloading of the wafer 2 are carried out.

The provisional placement part 240 temporarily holds the wafer 2 before being loaded onto the chuck table 220 or after being unloaded from the chuck table 220. The provisional placement part 240 includes a vacuum chuck mechanism and detachably holds the wafer 2. The wafer 2 loaded into the grinding apparatus 200 by the conveying unit 600 is placed at the provisional placement part 240 and then goes through the position adjustment unit 250 to be loaded onto the chuck table 220. The wafer 2 unloaded from the chuck table 220 after the end of grinding goes through the cleaning unit 260 and is placed at the provisional placement part 240 and then is unloaded from the grinding apparatus 200 by the conveying unit 600.

The position adjustment unit 250 locates the wafer 2 at a predetermined position. Before the wafer 2 is loaded onto the chuck table 220, the front surface of the wafer 2 or the front surface of the protective tape, which is to be opposed to the holding surface of the chuck table 220, may be cleaned.

The cleaning unit 260 cleans the wafer 2 unloaded from the chuck table 220. The cleaning unit 260 supplies a cleaning liquid to the front surface and back surface of the wafer 2 to clean the wafer 2. If a protective tape is stuck to the front surface of the wafer 2, the protective tape is cleaned by the cleaning unit 260.

The first conveying apparatus 270 conveys the wafer 2 between the provisional placement part 240 and the position adjustment unit 250. The first conveying apparatus 270 has an arm 272 and a hand 274 that is provided at the tip part of the arm 272 and holds the wafer 2. By operation of the arm 272, the hand 274 moves in the X-axis direction, the Y-axis direction, and the Z-axis direction.

The second conveying apparatus 280 has a first conveying arm 282 and a second conveying arm 284. A suction pad that holds the wafer 2 by suction is provided at each of the tip part of the first conveying arm 282 and the tip part of the second conveying arm 284. The first conveying arm 282 unloads the wafer 2 from the position adjustment unit 250 and loads the wafer 2 onto the chuck table 220. The second conveying arm 284 unloads the wafer 2 from the chuck table 220 and loads the wafer 2 into the cleaning unit 260.

The wafer 2 that is loaded into the grinding apparatus 200 by the conveying unit 600 and is placed at the provisional placement part 240 is passed to the position adjustment unit 250 by the first conveying apparatus 270. The position adjustment unit 250 carries out position adjustment of causing the position of the wafer 2 to match a predetermined position. The wafer 2 whose position is adjusted by the position adjustment unit 250 is loaded onto the chuck table 220 disposed at the load/unload position by the first conveying arm 282. The turntable 230 rotates and thereby the chuck table 220 disposed at the load/unload position moves to a grinding position.

In the state in which the wafer 2 held by the chuck table 220 moved to the grinding position is in contact with the grinding stones of the grinding unit 210, the grinding wheel of the grinding unit 210 rotates around the grinding rotation axis concurrently with the rotation of the chuck table 220. Thereby, the back surface of the wafer 2 is ground and the wafer 2 is thinned. Rough grinding and finish grinding are carried out by the two grinding units 210 and thereby the wafer 2 is thinned.

After the grinding of the wafer 2 ends, the turntable 230 rotates and thereby the chuck table 220 disposed at the grinding position moves to the load/unload position.

The second conveying arm 284 unloads the wafer 2 after the grinding from the chuck table 220 disposed at the load/unload position. The second conveying arm 284 conveys the wafer 2 to the cleaning unit 260. The cleaning unit 260 cleans the wafer 2 or the protective tape conveyed from the second conveying arm 284. The wafer 2 cleaned by the cleaning unit 260 is passed from the cleaning unit 260 to the first conveying apparatus 270. The first conveying apparatus 270 places the wafer 2 at the provisional placement part 240. The wafer 2 placed at the provisional placement part 240 is unloaded from the grinding apparatus 200 by the conveying unit 600.

(Tape Sticking Apparatus)

The tape sticking apparatus 300 has the frame-unit forming means 310, the separating means 320, an alignment unit 330 that carries out alignment of the wafer 2, a provisional placement part 340 that temporarily holds the wafer 2, and an unloading provisional placement part 350 that temporarily holds the wafer 2 to be unloaded.

The frame-unit forming means 310 sticks a dicing tape to the back surface of the wafer 2 ground by the grinding apparatus 200 and fixes an annular frame to the outer circumferential edge of the dicing tape. In the state in which the annular frame is disposed around the wafer 2, the frame-unit forming means 310 sticks the dicing tape to the back surface of the wafer 2 and the back surface of the annular frame and cuts the dicing tape along the annular frame. Thereby, the annular frame is fixed to the outer circumferential edge of the dicing tape. The wafer 2 is supported by the annular frame through the dicing tape.

The separating means 320 separates the protective tape stuck to the front surface of the wafer 2. The alignment unit 330 carries out position adjustment of the wafer 2 with respect to the annular frame. The alignment unit 330 has an alignment table on which the wafer 2 is placed and plural alignment pins for adjusting the center position of the wafer 2 placed on the alignment table to a prescribed position. The alignment pins move in the radial direction of the wafer 2 to carry out position adjustment of the wafer 2.

The provisional placement part 340 temporarily holds the wafer 2 before being loaded onto the alignment unit 330. The provisional placement part 340 includes a vacuum chuck mechanism and detachably holds the wafer 2. The wafer 2 loaded into the tape sticking apparatus 300 by the conveying unit 600 is placed at the provisional placement part 340 and then goes through the alignment unit 330 to be conveyed to the frame-unit forming means 310 and the separating means 320.

The wafer 2 that has been supported by the annular frame through the dicing tape in the frame-unit forming means 310 and from which the protective tape has been separated in the separating means 320 is conveyed to the unloading provisional placement part 350.

(First Cassette Placement Part)

At the first cassette placement part 400, the first cassette 410 that houses plural wafers 2 each having the front surface to which the protective tape is stuck is placed. In the present embodiment, two first cassettes 410 are set at positions opposed to the grinding apparatus 200. Furthermore, one first cassette 410 is set at a position opposed to the laser processing apparatus 100.

(Second Cassette Placement Part)

At the second cassette placement part 500, the second cassette 510 that houses plural wafers 2 each supported in the opening of the annular frame by the dicing tape is placed. In the present embodiment, one second cassette 510 is set at a position opposed to the laser processing apparatus 100. Furthermore, one second cassette 510 is set at a position opposed to the tape sticking apparatus 300.

(Conveying Unit)

The conveying unit 600 conveys the wafers 2 among the laser processing apparatus 100, the grinding apparatus 200, the tape sticking apparatus 300, the first cassettes 410, and the second cassettes 510. In the present embodiment, the laser processing apparatus 100, the grinding apparatus 200, and the tape sticking apparatus 300 are disposed in the Y-axis direction. In the Y-axis direction, the laser processing apparatus 100 is disposed between the grinding apparatus 200 and the tape sticking apparatus 300. In the Y-axis direction, the distance between the tape sticking apparatus 300 and the grinding apparatus 200 is longer than the distance between the laser processing apparatus 100 and the grinding apparatus 200. The conveying unit 600 is disposed on the −X-direction side relative to the laser processing apparatus 100.

FIG. 2 is a side view schematically showing one example of the conveying unit 600 according to the present embodiment. As shown in FIG. 1 and FIG. 2, the wafer processing system 1 including the conveying unit 600 is disposed inside a chamber 900. The conveying unit 600 has a conveying unit 610A and a conveying unit 610B that can hold and convey the wafer 2 and a conveying unit 620 that can convey the wafer 2 through the annular frame.

As shown in FIG. 2, the conveying unit 610A is supported by a ceiling part of the chamber 900. The conveying unit 610A has a suction pad 612A that detachably holds the wafer 2. The suction pad 612A has a holding surface that holds the wafer 2 by suction. The holding surface of the suction pad 612A is oriented downward. The holding surface of the suction pad 612A is substantially parallel to the XY-plane. Suction ports connected to a vacuum suction source are made in the holding surface of the suction pad 612A. The vacuum suction source operates in the state in which the holding surface of the suction pad 612A is in contact with the wafer 2, and thereby the wafer 2 is held by the suction pad 612A by suction. By stop of the operation of the vacuum suction source, the wafer 2 is released from the suction pad 612A.

The outer shape and dimensions of the suction pad 612A in the XY-plane are substantially the same as the outer shape and dimensions of the wafer 2. The suction pad 612A can hold almost the whole of the front surface of the wafer 2 by suction.

Furthermore, the conveying unit 610A has a movement table 614A that can move in the Y-axis direction and a movable arm 616A supported by the movement table 614A. The suction pad 612A is joined to the tip part of the movable arm 616A.

The movement table 614A is movably supported by the ceiling part of the chamber 900 with the intermediary of a movement mechanism 630A. The movement table 614A moves in the Y-axis direction by the movement mechanism 630A. The movement mechanism 630A has a guide member 632A that is provided at the ceiling part of the chamber 900 and guides the movement table 614A in the Y-axis direction, and an actuator 634A that generates power for moving the movement table 614A in the Y-axis direction. The actuator 634A includes a linear motor or a ball screw mechanism for example.

The suction pad 612A can move in the Y-axis direction and the Z-axis direction by operation of the movement mechanism 630A and the movable arm 616A. The conveying unit 610B is supported by a sidewall part of the chamber 900. The conveying unit 610B is provided on the −Z-side relative to the conveying unit 610A and moves on the lower side relative to the conveying unit 610A. The conveying unit 610B has a suction pad 612B that detachably holds the wafer 2, a movement table 614B that can move in the Y-axis direction, and a movable arm 616B supported by the movement table 614B. The suction pad 612B is joined to the tip part of the movable arm 616B.

The movement table 614B is movably supported by the sidewall part of the chamber 900 with the intermediary of a movement mechanism 630B. The movement table 614B moves in the Y-axis direction by the movement mechanism 630B. The movement mechanism 630B has a guide member 642 that is provided at the sidewall part of the chamber 900 and guides the movement table 614B in the Y-axis direction, and an actuator 634B that generates power for moving the movement table 614B in the Y-axis direction. The actuator 634B includes a linear motor or a ball screw mechanism for example. The suction pad 612B can move in the X-axis direction, the Y-axis direction, and the Z-axis direction by operation of the movement mechanism 630B and the movable arm 616B.

As above, in the present embodiment, the conveying unit 610B can move below the conveying unit 610A separately from the conveying unit 610A. Therefore, for example, conveyance operation for the wafer 2 by the conveying unit 610B can be carried out concurrently with conveyance operation for the wafer 2 by the conveying unit 610A.

As shown in FIG. 1, the conveying unit 620 has a holding hand 622 that holds the annular frame that supports the wafer 2. The holding hand 622 has a support member 622A that supports one surface of the annular frame and engagement members 622B opposed to the support member 622A with the intermediary of a gap. Part of the annular frame is inserted between the support member 622A and the engagement members 622B and thereby the annular frame is held by the holding hand 622. Furthermore, an opening 622M is made at the center of the support member 622A.

Similarly to the conveying unit 610B, the conveying unit 620 moves below the conveying unit 610A. The conveying unit 620 has a movement table 624 that can move in the Y-axis direction and a movable arm 626 supported by the movement table 624. The holding hand 622 is joined to the tip part of the movable arm 626.

The movement table 624 moves in the Y-axis direction by a movement mechanism 640. The movement mechanism 640 has the guide member 642 that guides the movement table 624 in the Y-axis direction and an actuator that generates power for moving the movement table 624 in the Y-axis direction. The actuator of the movement mechanism 640 includes a linear motor or a ball screw mechanism for example. The holding hand 622 can move in the X-axis direction, the Y-axis direction, and the Z-axis direction by operation of the movement mechanism 640 and the movable arm 626.

The conveying unit 610A and the conveying unit 610B can carry out loading of the wafer 2 into the laser processing apparatus 100, unloading of the wafer 2 from the laser processing apparatus 100, loading of the wafer 2 into the grinding apparatus 200, unloading of the wafer 2 from the grinding apparatus 200, and loading of the wafer 2 into the tape sticking apparatus 300. The conveying unit 620 can carry out loading of the wafer 2 into the laser processing apparatus 100, unloading of the wafer 2 from the laser processing apparatus 100, loading of the wafer 2 into the grinding apparatus 200, unloading of the wafer 2 from the grinding apparatus 200, and unloading of the wafer 2 from the tape sticking apparatus 300.

The conveying unit 610B can convey the wafer 2 concurrently with conveyance operation for the wafer 2 by the conveying unit 610A. For example, the conveying unit 610B can load the wafer 2 after grinding into the tape sticking apparatus 300 concurrently with operation of loading the wafer 2 from the first cassette 410 into the laser processing apparatus 100 by the conveying unit 610A. Furthermore, the conveying unit 620 can convey the wafer 2 (annular frame) concurrently with conveyance operation for the wafer 2 by at least one of the conveying unit 610A and the conveying unit 610B.

(Control Means)

Figure 3:
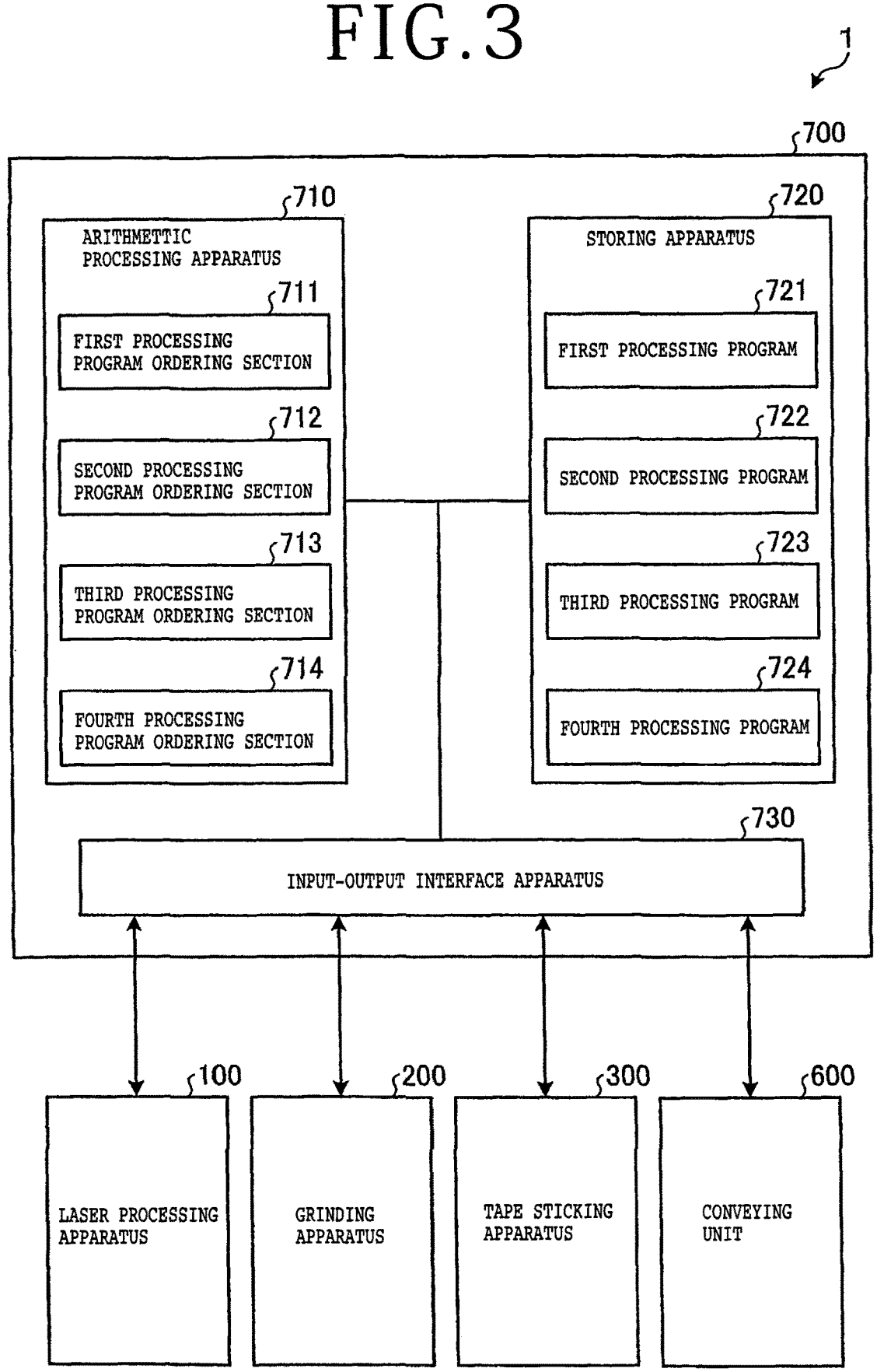
FIG. 3 is a block diagram showing the wafer processing system according to the embodiment.

FIG. 3 is a block diagram showing the wafer processing system 1 according to the present embodiment. The control means 700 controls the laser processing apparatus 100, the grinding apparatus 200, the tape sticking apparatus 300, and the conveying unit 600, which are constituent elements of the wafer processing system 1.

The control means 700 has an arithmetic processing apparatus 710 having a microprocessor like a central processing unit (CPU), a storing apparatus 720 including a non-volatile memory like a read only memory (ROM) and a storage and a volatile memory like a random access memory (RAM), and an input-output interface apparatus 730. The arithmetic processing apparatus 710 executes arithmetic processing in accordance with a computer program stored in the storing apparatus 720 and outputs a control signal for controlling the wafer processing system 1 through the input-output interface apparatus 730.

The arithmetic processing apparatus 710 has a first processing program instructing or ordering section 711 that outputs a control signal in accordance with a first processing program 721, a second processing program instructing or ordering section 712 that outputs a control signal in accordance with a second processing program 722, a third processing program instructing or ordering section 713 that outputs a control signal in accordance with a third processing program 723, and a fourth processing program instructing or ordering section 714 that outputs a control signal in accordance with a fourth processing program 724.

The storing apparatus 720 stores the first processing program 721, the second processing program 722, the third processing program 723, and the fourth processing program 724. The first processing program 721 is a program that causes the wafer 2 unloaded from the first cassette 410 to be conveyed by the conveying unit 600 in order of the laser processing apparatus 100, the grinding apparatus 200, the tape sticking apparatus 300, and the second cassette 510 and causes processing by each apparatus to be sequentially carried out for the one wafer 2.

The first processing program instructing section 711 outputs a control signal for conveying the wafer 2 unloaded from the first cassette 410 in order of the laser processing apparatus 100, the grinding apparatus 200, the tape sticking apparatus 300, and the second cassette 510 and sequentially carrying out processing by each apparatus for the one wafer 2.

The second processing program 722 is a program that causes the wafer 2 unloaded from the first cassette 410 to be conveyed by the conveying unit 600 in order of the grinding apparatus 200, the laser processing apparatus 100, the tape sticking apparatus 300, and the second cassette 510 and causes processing by each apparatus to be sequentially carried out for the one wafer 2.

The second processing program instructing section 712 outputs a control signal for conveying the wafer 2 unloaded from the first cassette 410 in order of the grinding apparatus 200, the laser processing apparatus 100, the tape sticking apparatus 300, and the second cassette 510 and sequentially carrying out processing by each apparatus for the one wafer 2.

The third processing program 723 is a program that causes the wafer 2 unloaded from the first cassette 410 to be conveyed by the conveying unit 600 in order of the grinding apparatus 200 and the tape sticking apparatus 300 and causes processing by each apparatus to be sequentially carried out for the one wafer 2.

The third processing program instructing section 713 outputs a control signal for conveying the wafer 2 unloaded from the first cassette 410 in order of the grinding apparatus 200 and the tape sticking apparatus 300 and sequentially carrying out processing by each apparatus for the one wafer 2.

The fourth processing program 724 is a program that causes the wafer 2 unloaded from the first cassette 410 or the second cassette 510 to be conveyed to the laser processing apparatus 100 by the conveying unit 600 and causes processing by the laser processing apparatus 100 to be carried out for the one wafer 2.

The fourth processing program instructing section 714 outputs a control signal for conveying the wafer 2 unloaded from the first cassette 410 or the second cassette 510 to the laser processing apparatus 100 and carrying out processing by the laser processing apparatus 100 for the wafer 2.

The third processing program instructing section 713 and the fourth processing program instructing section 714 output the control signal in such a manner that the third processing program 723 and the fourth processing program 724 are concurrently executed.

[Wafer]

Figure 4:
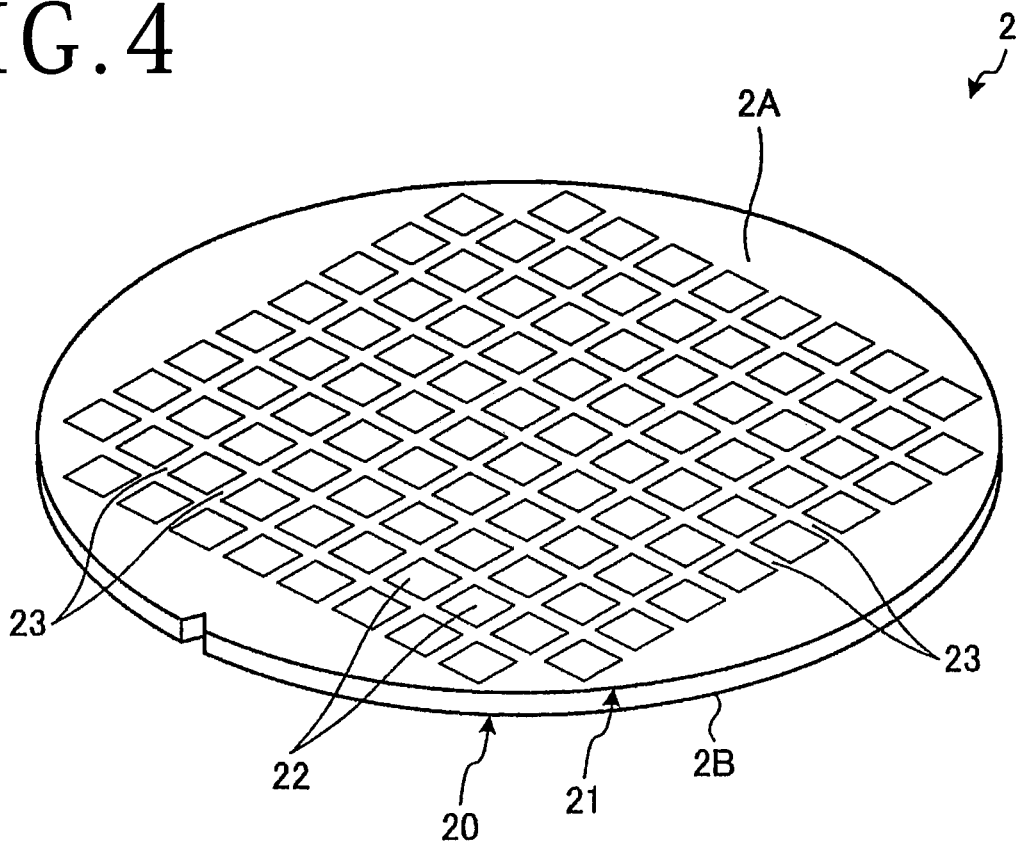
FIG. 4 is a perspective view showing one example of a wafer according to the embodiment.

FIG. 4 is a perspective view showing one example of the wafer 2 according to the present embodiment. As shown in FIG. 4, the wafer 2 has a substrate 20 and a functional layer 21 provided on the substrate 20. The wafer 2 is a member having a substantially circular plate shape and has a front surface 2A and a back surface 2B oriented in the opposite direction to the front surface 2A. The substrate 20 contains at least one of a silicon substrate, a sapphire substrate, a lithium tantalate substrate, a lithium niobate substrate, and a ceramic substrate. The functional layer 21 is a layer to form devices 22 and is stacked on the front surface of the substrate 20. The functional layer 21 is partitioned by planned dividing lines 23 formed in a lattice manner.

The front surface 2A of the wafer 2 includes the front surface of the functional layer 21. The back surface 2B of the wafer 2 includes the back surface of the substrate 20. The wafer 2 has the front surface 2A on which the devices 22 are formed in plural regions partitioned by the plural planned dividing lines 23 that intersect.

The devices 22 are disposed in the wafer 2 in a matrix manner. The devices 22 are partitioned by the planned dividing lines 23 in a lattice manner. The wafer 2 is divided along the planned dividing lines 23 and thereby device chips such as an integrated circuit (IC) or large scale integration (LSI) are manufactured.

Figure 5:
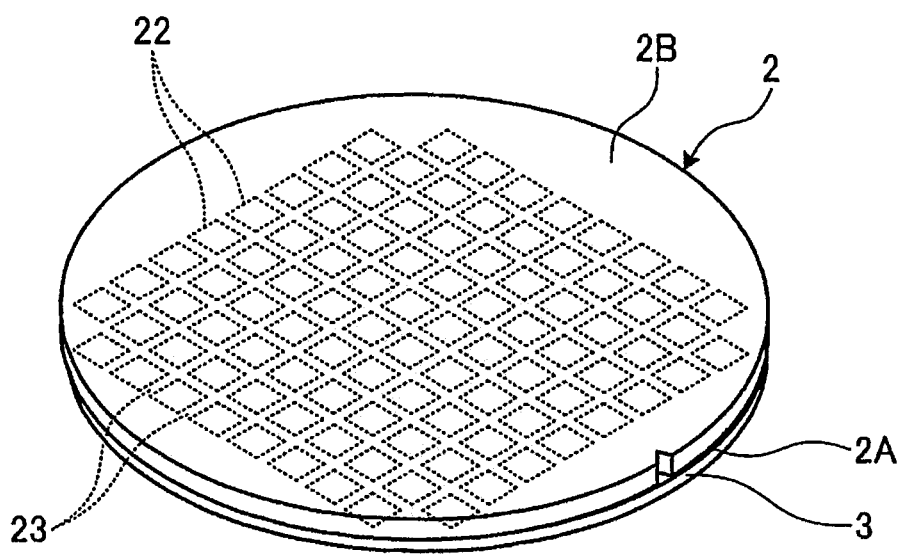
FIG. 5 is a perspective view showing one example of the wafer in a first state according to the embodiment.
Figure 6:
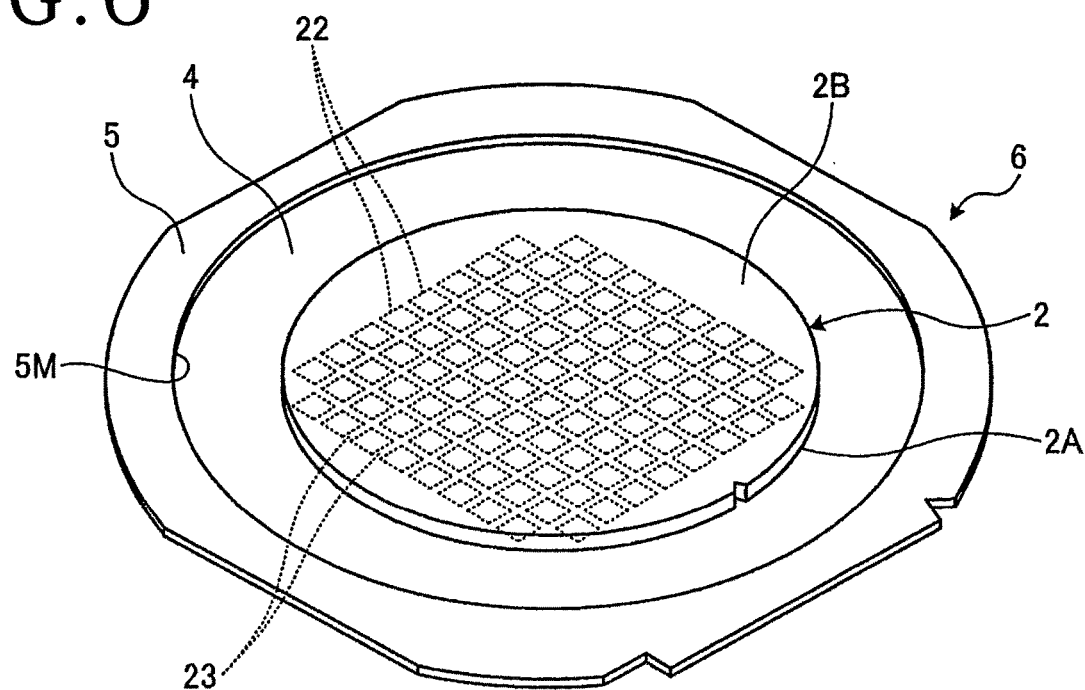
FIG. 6 is a perspective view showing one example of the wafer in a second state according to the embodiment.
Figure 7:
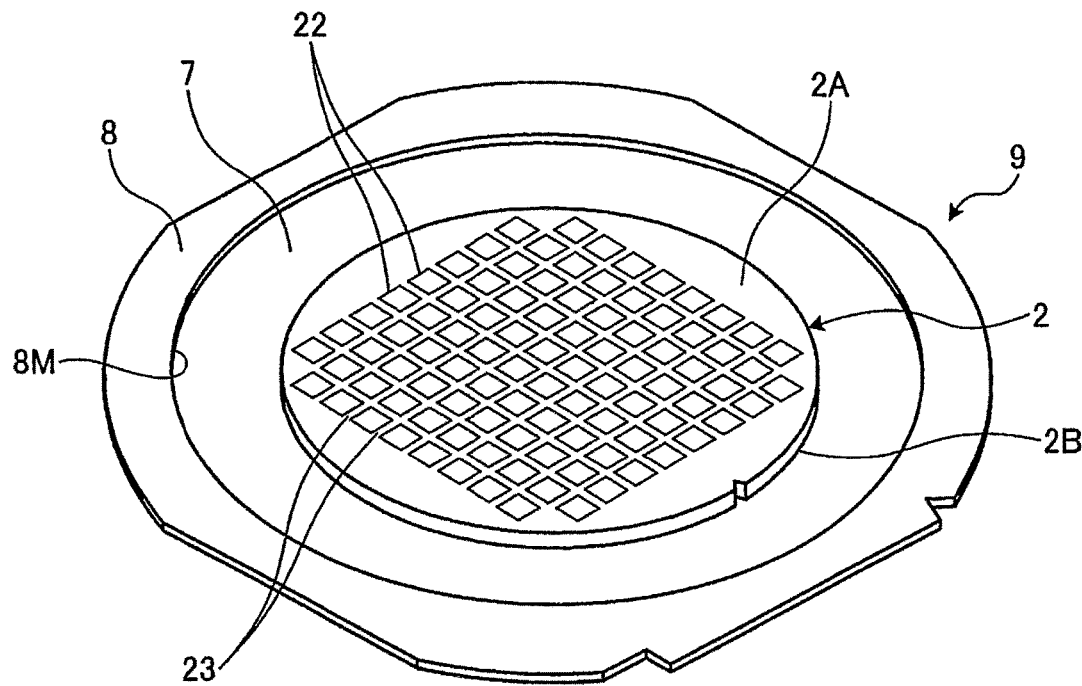
FIG. 7 is a perspective view showing one example of the wafer in a third state according to the embodiment.

In the present embodiment, the wafer 2 is conveyed or processed or stored in either one state of a first state, a second state, and a third state. FIG. 5 is a perspective view showing one example of the wafer 2 in the first state according to the present embodiment. FIG. 6 is a perspective view showing one example of the wafer 2 in the second state according to the present embodiment. FIG. 7 is a perspective view showing one example of the wafer 2 in the third state according to the present embodiment.

As shown in FIG. 5, in the wafer 2 according to the first state, a protective tape 3 is stuck to the front surface 2A. The protective tape 3 is a sheet-shaped member. The protective tape 3 may be made of any of a synthetic resin, a metal, ceramic, and glass. The outer shape and dimensions of the protective tape 3 are substantially identical to the outer shape and dimensions of the wafer 2. The whole of the front surface 2A of the wafer 2 is covered by the protective tape 3. By the sticking of the protective tape 3 to the front surface 2A of the wafer 2, the devices 22 formed on the front surface 2A are protected.

As shown in FIG. 6, in the wafer 2 according to the second state, a dicing tape 4 is stuck to the front surface 2A. The dicing tape 4 is a sheet-shaped member. The dimensions of the outer shape of the dicing tape 4 are larger than the dimensions of the outer shape of the wafer 2. An annular frame 5 is fixed to the outer circumferential edge of the dicing tape 4. The wafer 2 is supported in an opening 5M of the annular frame 5 through the dicing tape 4. The wafer 2 according to the second state forms a frame unit 6 integrated with the dicing tape 4 and the annular frame 5.

As shown in FIG. 7, in the wafer 2 according to the third state, a dicing tape 7 is stuck to the back surface 2B. The dicing tape 7 is a sheet-shaped member. The dimensions of the outer shape of the dicing tape 7 are larger than the dimensions of the outer shape of the wafer 2. An annular frame 8 is fixed to the outer circumferential edge of the dicing tape 7. The wafer 2 is supported in an opening 8M of the annular frame 8 through the dicing tape 7. The wafer 2 according to the third state forms a frame unit 9 integrated with the dicing tape 7 and the annular frame 8.

The wafer 2 according to the first state, described with reference to FIG. 5, is housed in the first cassette 410. The wafer 2 according to the second state and the wafer 2 according to the third state, described with reference to FIG. 6 and FIG. 7, are housed in the second cassette 510.

[Method for Processing Wafer]
(Method for Processing Wafer Based on First Processing Program)

Figure 8:
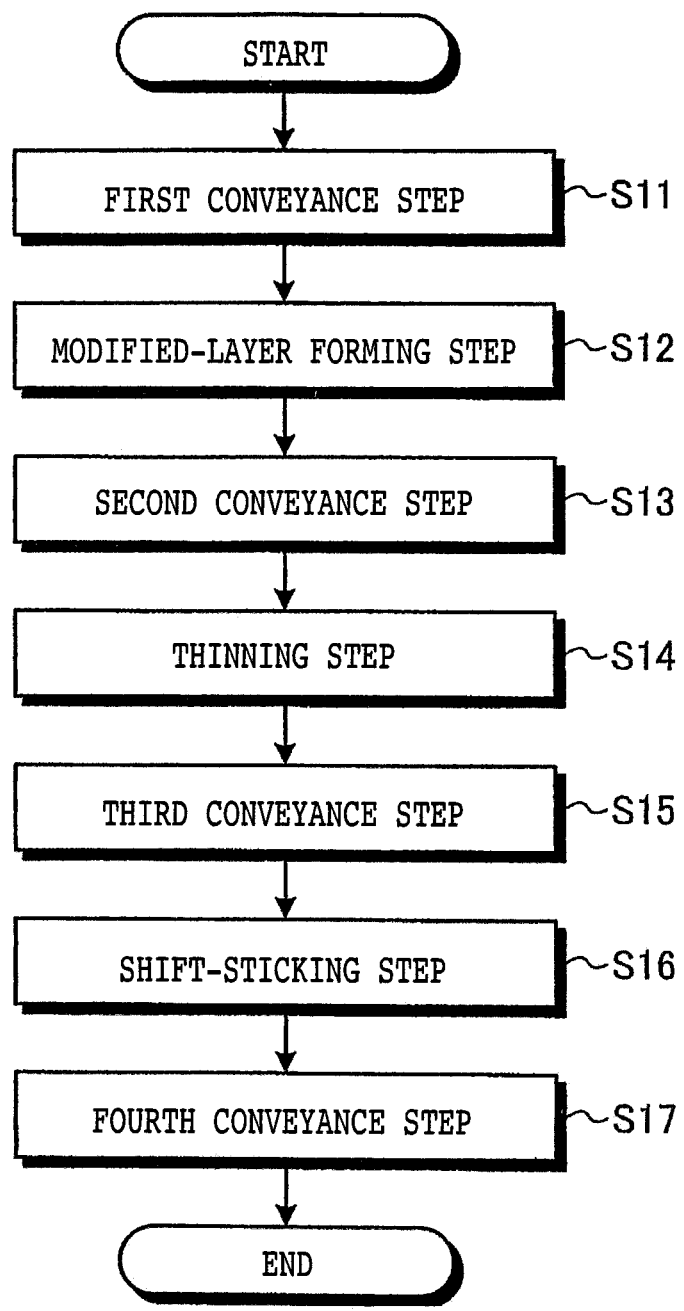
FIG. 8 is a flowchart showing one example of a method for processing the wafer based on a first processing program according to the embodiment.

Next, methods for processing the wafer 2 according to the present embodiment will be described. First, a method for processing the wafer 2 based on the first processing program will be described. FIG. 8 is a flowchart showing one example of the method for processing the wafer 2 based on the first processing program according to the present embodiment.

As shown in FIG. 8, the method for processing the wafer 2 based on the first processing program includes the following steps: a first conveyance step (S11) of conveying the wafer 2 in the first state unloaded from the first cassette 410 to the laser processing apparatus 100; a modified-layer forming step (S12) of forming modified layers inside the wafer 2 along the planned dividing lines 23 by irradiating the wafer 2 conveyed to the laser processing apparatus 100 with a laser beam; a second conveyance step (S13) of conveying the wafer 2 in which the modified layers have been formed to the grinding apparatus 200; a thinning step (S14) of thinning the wafer 2 by grinding the back surface 2B of the wafer 2 conveyed to the grinding apparatus 200; a third conveyance step (S15) of conveying the thinned wafer 2 to the tape sticking apparatus 300; a shift-sticking step (S16) of sticking the dicing tape 7 to the back surface 2B of the wafer 2 conveyed to the tape sticking apparatus 300 and fixing the annular frame 8 to the outer circumferential edge of the dicing tape 7 to form the frame unit 9 and then separating the protective tape 3 stuck to the front surface 2A of the wafer 2; and a fourth conveyance step (S17) of conveying the wafer 2 in the third state generated in the tape sticking apparatus 300 to the second cassette 510.

Figure 9:
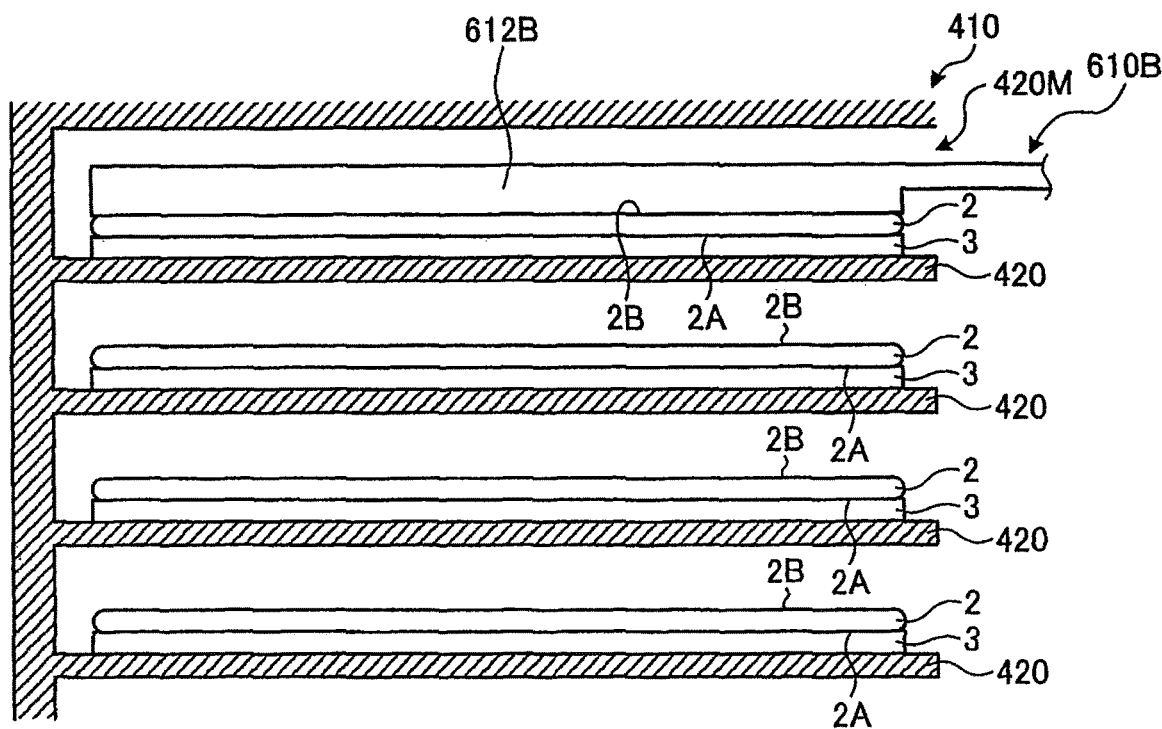
FIG. 9 is a diagram schematically showing one example of a first conveyance step according to the embodiment.

The first conveyance step (S11) will be described. FIG. 9 is a diagram schematically showing one example of the first conveyance step according to the present embodiment. As shown in FIG. 9, plural wafers 2 each having the front surface 2A to which the protective tape 3 is stuck are housed in the first cassette 410. The first cassette 410 has plural shelves 420 disposed in the Z-axis direction. The wafer 2 in the first state is supported by each of the shelves 420. The control means 700 outputs, to the conveying unit 600, a control signal for unloading the wafer 2 in the first state from the first cassette 410 and conveying the wafer 2 to the laser processing apparatus 100. In the present embodiment, the wafer 2 in the first state is unloaded from the first cassette 410 by the conveying unit 610A or the conveying unit 610B. For example, the conveying unit 610B causes the suction pad 612B to enter the inside of the first cassette 410 through an opening 420M made in the first cassette 410. The conveying unit 610B holds the back surface 2B of the wafer 2 by suction by the suction pad 612B and unloads the wafer 2 in the first state from the first cassette 410 to convey the wafer 2 to the laser processing apparatus 100.

Figure 10:
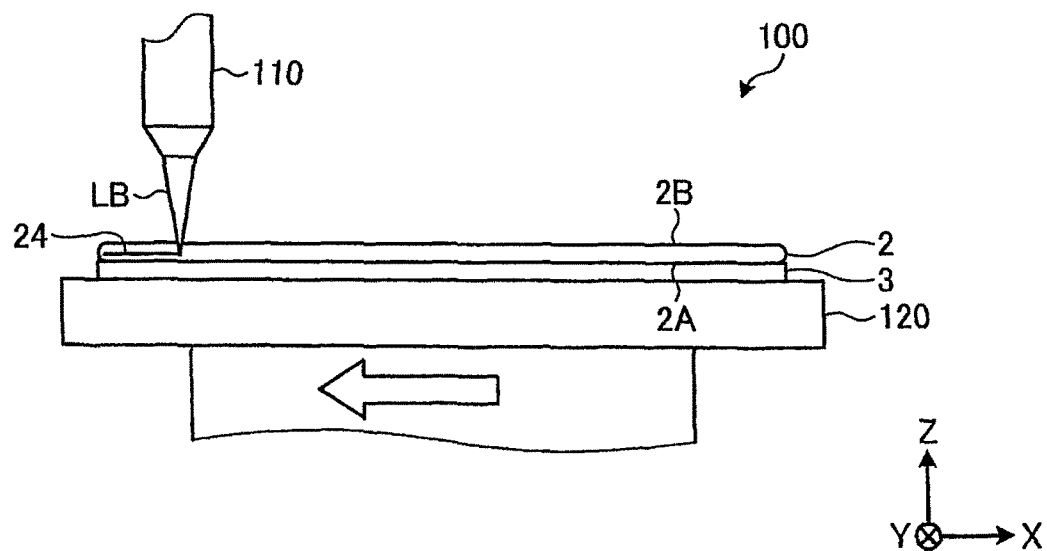
FIG. 10 is a diagram schematically showing one example of a modified-layer forming step according to the embodiment.

Next, the modified-layer forming step (S12) will be described. FIG. 10 is a diagram schematically showing one example of the modified-layer forming step according to the present embodiment. The control means 700 outputs a control signal for forming modified layers 24 in the wafer 2 to the laser processing apparatus 100. As shown in FIG. 10, the wafer 2 in the first state is held by the chuck table 120 of the laser processing apparatus 100. The chuck table 120 holds the wafer 2 with the intermediary of the protective tape 3. The chuck table 120 holds the wafer 2 in such a manner that the protective tape 3 is opposed to the holding surface of the chuck table 120 and the back surface 2B of the wafer 2 is oriented upward.

After the wafer 2 in the first state is held by the chuck table 120, the control means 700 controls the table moving apparatus 130 to dispose the planned dividing line 23 of the wafer 2 to the irradiation position of a laser beam LB emitted from the laser beam irradiation unit 110. The control means 700 controls the table moving apparatus 130 to move the chuck table 120 relative to the laser beam LB.

In the modified-layer forming step, the laser beam irradiation unit 110 emits the laser beam LB having such a wavelength as to be transmitted through the wafer 2. The wafer 2 is irradiated with the laser beam LB from the side of the back surface 2B of the wafer 2 along the planned dividing line 23. Thereby, the modified layer 24 is formed inside the wafer 2 along the planned dividing line 23.

Next, the second conveyance step (S13) will be described. The control means 700 outputs, to the conveying unit 600, a control signal for conveying the wafer 2 from the laser processing apparatus 100 to the grinding apparatus 200. The wafer 2 in which the modified layers 24 have been formed and that has been unloaded from the chuck table 120 is unloaded from the laser processing apparatus 100 by the conveying unit 610A or the conveying unit 610B of the conveying unit 600 and is conveyed to the grinding apparatus 200. For example, the conveying unit 610B holds the back surface 2B of the wafer 2 by suction by the suction pad 612B and unloads the wafer 2 in the first state from the laser processing apparatus 100 to convey the wafer 2 to the grinding apparatus 200.

Figure 11:
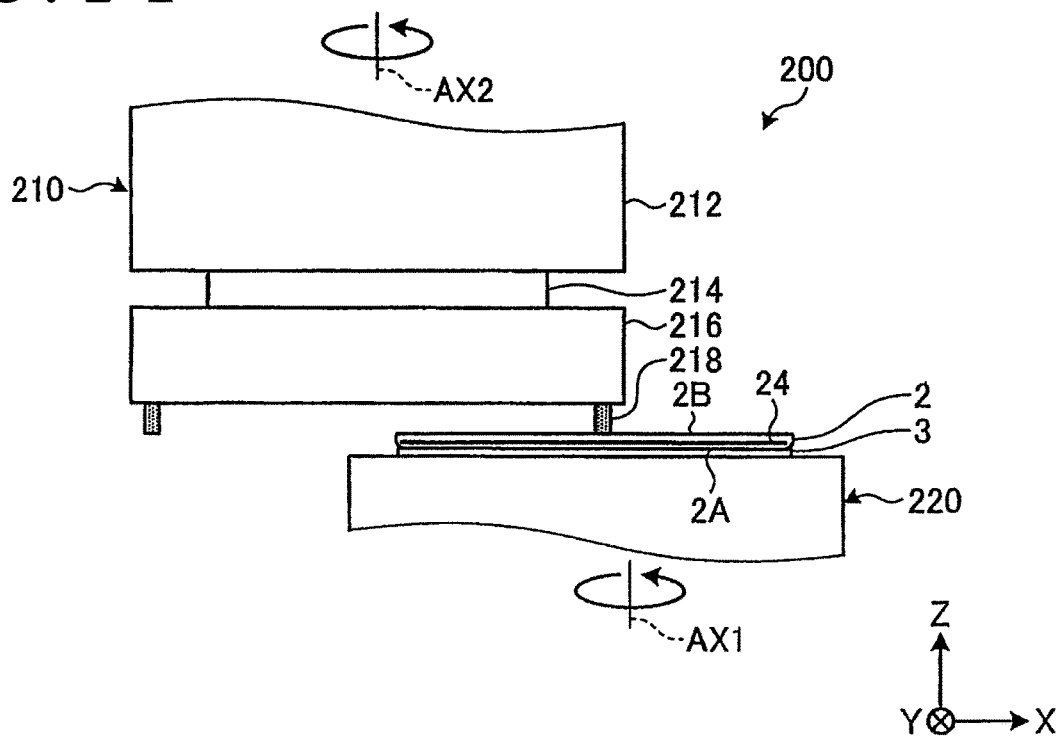
FIG. 11 is a diagram schematically showing one example of a thinning step according to the embodiment.

Next, the thinning step (S14) will be described. FIG. 11 is a diagram schematically showing one example of the thinning step according to the present embodiment. The control means 700 outputs a control signal for grinding the back surface 2B of the wafer 2 to thin the wafer 2 to the grinding apparatus 200. As shown in FIG. 11, the wafer 2 in the first state is held by the chuck table 220 of the grinding apparatus 200. The chuck table 220 holds the wafer 2 with the intermediary of the protective tape 3. The chuck table 220 holds the wafer 2 in such a manner that the protective tape 3 is opposed to the holding surface of the chuck table 220 and the back surface 2B of the wafer 2 is oriented upward. The chuck table 220 can rotate around a table rotation axis AX1 parallel to the Z-axis by operation of the actuator.

The grinding unit 210 of the grinding apparatus 200 has the spindle housing 212, a spindle 214 rotatably supported by the spindle housing 212, a grinding wheel 216 provided at the lower end part of the spindle 214, and grinding stones 218 disposed on the lower surface of the grinding wheel 216. The grinding wheel 216 can rotate around a grinding rotation axis AX2 parallel to the Z-axis by operation of the actuator. In the XY-plane, the grinding stones 218 are provided in a circular ring manner. The grinding stones 218 can be opposed to the back surface 2B of the wafer 2 held by the chuck table 220.

After the wafer 2 is held by the chuck table 220 with the intermediary of the protective tape 3, the grinding wheel 216 of the grinding unit 210 is rotated around the grinding rotation axis AX2 while the chuck table 220 is rotated around the table rotation axis AX1. In the state in which the chuck table 220 and the grinding wheel 216 are rotating, the grinding stones 218 are brought into contact with the back surface 2B of the wafer 2. Thereby, the back surface 2B of the wafer 2 is ground and the wafer 2 is thinned.

Next, the third conveyance step (S15) will be described. The control means 700 outputs, to the conveying unit 600, a control signal for conveying the wafer 2 from the grinding apparatus 200 to the tape sticking apparatus 300. The wafer 2 in which the modified layers 24 have been formed and that has been thinned is unloaded from the chuck table 220. The wafer 2 unloaded from the chuck table 220 is cleaned and then is unloaded from the grinding apparatus 200 by the conveying unit 610A of the conveying unit 600 to be conveyed to the tape sticking apparatus 300. The conveying unit 610A holds the back surface 2B of the wafer 2 by suction by the suction pad 612A and unloads the wafer 2 in the first state from the grinding apparatus 200 to convey the wafer 2 to the tape sticking apparatus 300.

Figure 12:
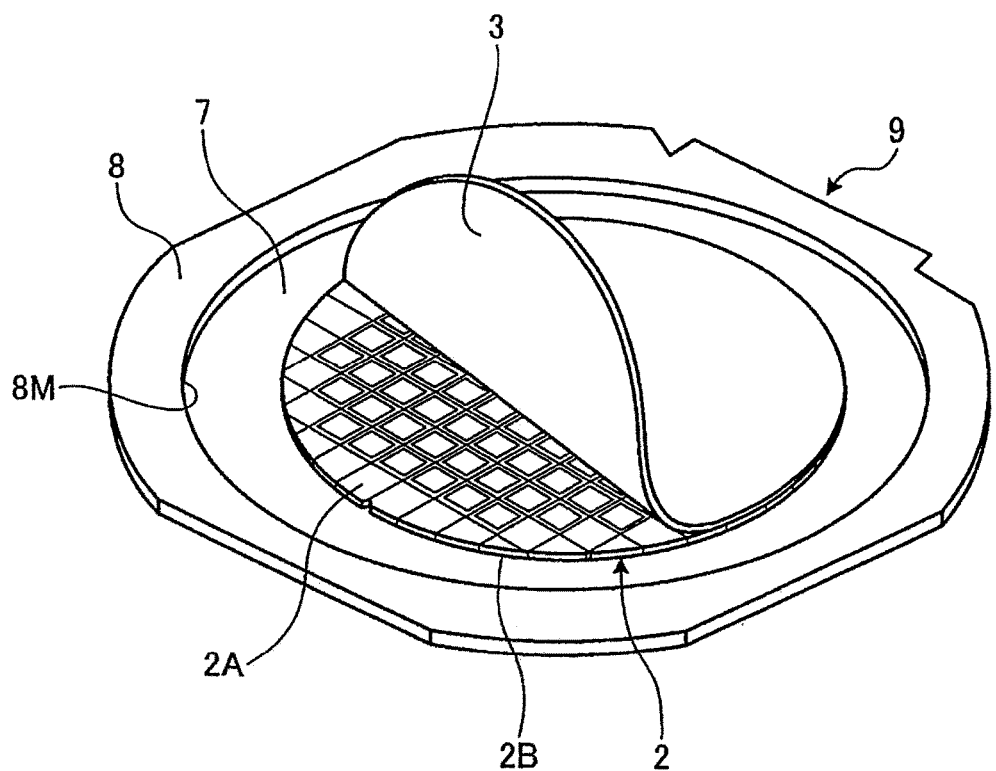
FIG. 12 is a diagram schematically showing one example of a shift-sticking step according to the embodiment.

Next, the shift-sticking step (S16) will be described. FIG. 12 is a diagram schematically showing one example of the shift-sticking step according to the present embodiment. The control means 700 outputs, to the frame-unit forming means 310 of the tape sticking apparatus 300, a control signal for sticking the dicing tape 7 to the back surface 2B of the wafer 2 ground by the grinding apparatus 200 and fixing the annular frame 8 to the outer circumferential edge of the dicing tape 7. Furthermore, the control means 700 outputs a control signal for separating the protective tape 3 stuck to the front surface 2A of the wafer 2 to the separating means 320 of the tape sticking apparatus 300. Due to this, as shown in FIG. 12, in the tape sticking apparatus 300, the wafer 2 in the third state in which the dicing tape 7 supported by the annular frame 8 is stuck to the back surface 2B and the protective tape 3 has been separated from the front surface 2A is generated.

Next, the fourth conveyance step (S17) will be described. The control means 700 outputs, to the conveying unit 600, a control signal for conveying the wafer 2 from the tape sticking apparatus 300 to the second cassette 510. The wafer 2 in the third state is unloaded from the tape sticking apparatus 300 by the conveying unit 600 and is conveyed to the second cassette 510. In the present embodiment, the frame unit 9 including the wafer 2 in the third state is placed at the unloading provisional placement part 350. Then, the frame unit 9 is slid and inserted into the second cassette 510 while being guided by a guide rail, and is housed therein.

(Method for Processing Wafer Based on Second Processing Program)

Figure 13:
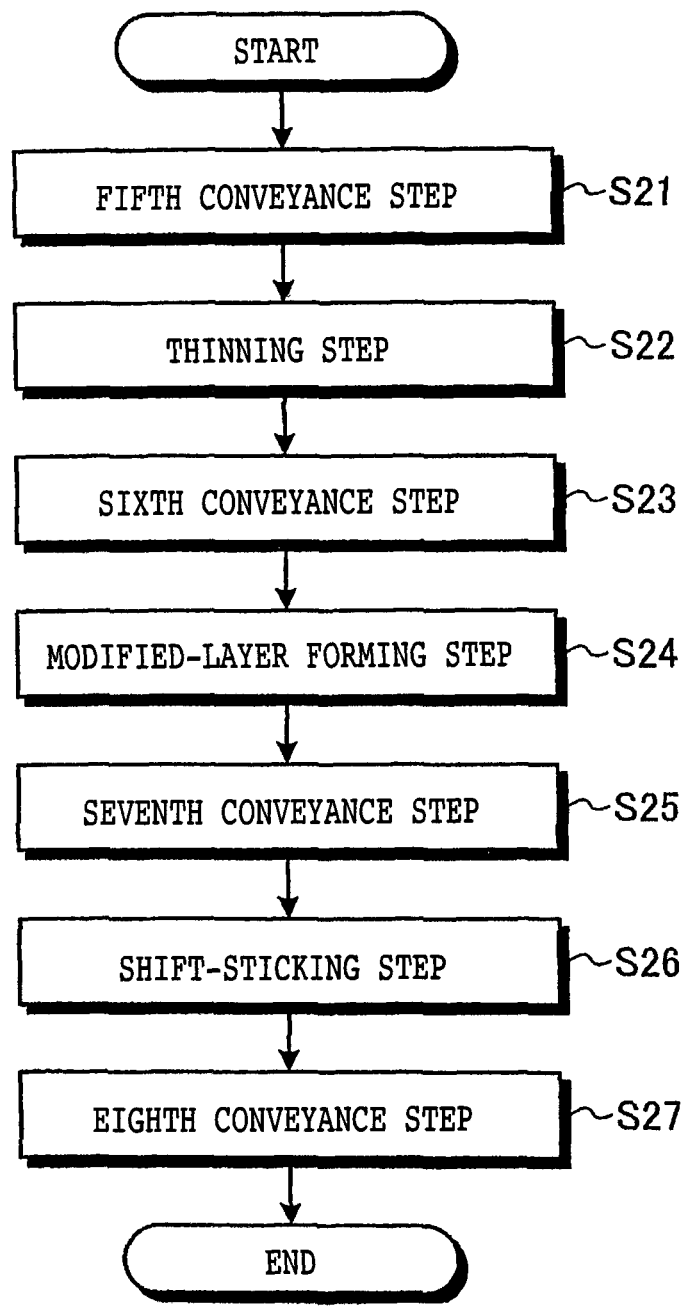
FIG. 13 is a flowchart showing one example of a method for processing the wafer based on a second processing program according to the embodiment.

Next, a method for processing the wafer 2 based on the second processing program will be described. FIG. 13 is a flowchart showing one example of the method for processing the wafer 2 based on the second processing program according to the present embodiment.

As shown in FIG. 13, the method for processing the wafer 2 based on the second processing program includes the following steps: a fifth conveyance step (S21) of conveying the wafer 2 in the first state unloaded from the first cassette 410 to the grinding apparatus 200; a thinning step (S22) of thinning the wafer 2 by grinding the back surface 2B of the wafer 2 conveyed to the grinding apparatus 200; a sixth conveyance step (S23) of conveying the thinned wafer 2 to the laser processing apparatus 100; a modified-layer forming step (S24) of forming modified layers inside the wafer 2 along the planned dividing lines 23 by irradiating the wafer 2 conveyed to the laser processing apparatus 100 with a laser beam; a seventh conveyance step (S25) of conveying the wafer 2 in which the modified layers have been formed to the tape sticking apparatus 300; a shift-sticking step (S26) of sticking the dicing tape 7 to the back surface 2B of the wafer 2 conveyed to the tape sticking apparatus 300 and fixing the annular frame 8 to the outer circumferential edge of the dicing tape 7 to form the frame unit 9 and then separating the protective tape 3 stuck to the front surface 2A of the wafer 2; and an eighth conveyance step (S27) of conveying the wafer 2 in the third state generated in the tape sticking apparatus 300 to the second cassette 510.

The fifth conveyance step (S21) will be described. The control means 700 outputs, to the conveying unit 600, a control signal for unloading the wafer 2 in the first state from the first cassette 410 and conveying the wafer 2 to the grinding apparatus 200. Similarly to the above-described first conveyance step S11, the wafer 2 in the first state is unloaded from the first cassette 410 by the conveying unit 610B in the fifth conveyance step S21. The conveying unit 610B holds the back surface 2B of the wafer 2 by suction by the suction pad 612B and unloads the wafer 2 in the first state from the first cassette 410 to convey the wafer 2 to the grinding apparatus 200.

Figure 14:
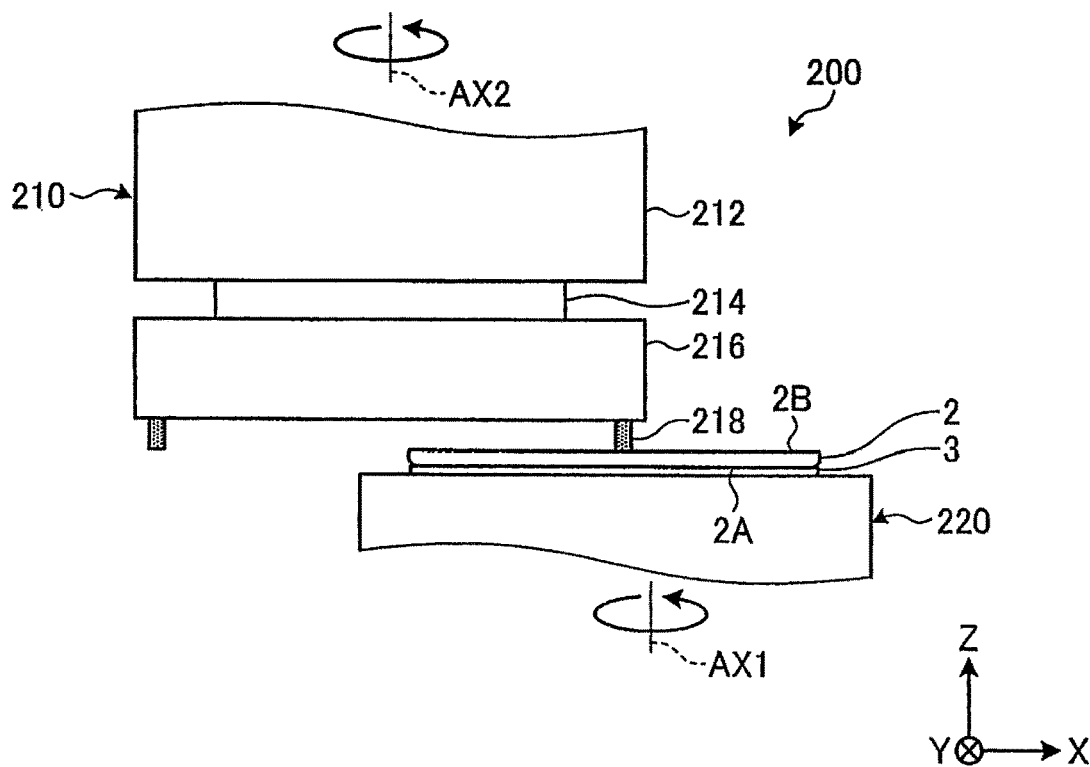
FIG. 14 is a diagram schematically showing one example of a thinning step according to the embodiment.

Next, the thinning step (S22) will be described. FIG. 14 is a diagram schematically showing one example of the thinning step according to the present embodiment. The control means 700 outputs a control signal for grinding the back surface 2B of the wafer 2 to thin the wafer 2 to the grinding apparatus 200. As shown in FIG. 14, the wafer 2 in the first state is held by the chuck table 220 of the grinding apparatus 200. The chuck table 220 holds the wafer 2 with the intermediary of the protective tape 3.

After the wafer 2 is held by the chuck table 220 with the intermediary of the protective tape 3, the grinding wheel 216 of the grinding unit 210 is rotated around the grinding rotation axis AX2 while the chuck table 220 is rotated around the table rotation axis AX1. In the state in which the chuck table 220 and the grinding wheel 216 are rotating, the grinding stones 218 are brought into contact with the back surface 2B of the wafer 2. Thereby, the back surface 2B of the wafer 2 is ground and the wafer 2 is thinned.

Next, the sixth conveyance step (S23) will be described. The control means 700 outputs, to the conveying unit 600, a control signal for conveying the wafer 2 from the grinding apparatus 200 to the laser processing apparatus 100. The thinned wafer 2 is unloaded from the chuck table 220. The wafer 2 unloaded from the chuck table 220 is unloaded from the grinding apparatus 200 by the conveying unit 610B of the conveying unit 600 and is conveyed to the laser processing apparatus 100. The conveying unit 610B holds the back surface 2B of the wafer 2 by suction by the suction pad 612B and unloads the wafer 2 in the first state from the grinding apparatus 200 to convey the wafer 2 to the laser processing apparatus 100.

Figure 15:
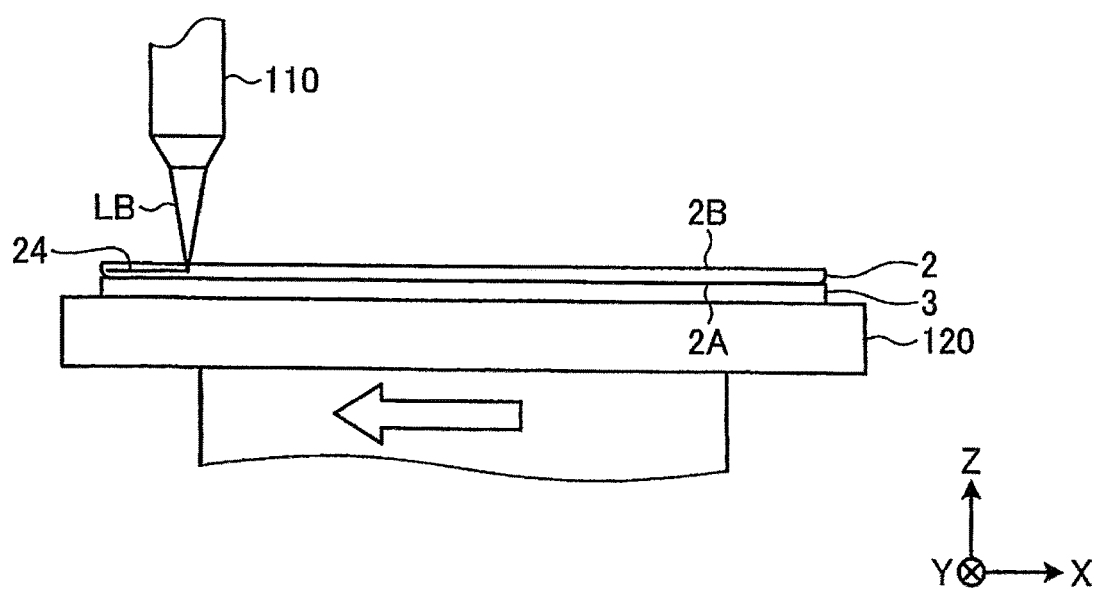
FIG. 15 is a diagram schematically showing one example of a modified-layer forming step according to the embodiment.

Next, the modified-layer forming step (S24) will be described. FIG. 15 is a diagram schematically showing one example of the modified-layer forming step according to the present embodiment. The control means 700 outputs a control signal for forming the modified layers 24 in the wafer 2 to the laser processing apparatus 100. As shown in FIG. 15, the thinned wafer 2 in the first state is held by the chuck table 120 of the laser processing apparatus 100. The chuck table 120 holds the wafer 2 with the intermediary of the protective tape 3. The chuck table 120 holds the wafer 2 in such a manner that the protective tape 3 is opposed to the holding surface of the chuck table 120 and the back surface 2B of the wafer 2 is oriented upward.

After the wafer 2 in the first state is held by the chuck table 120, the control means 700 controls the table moving apparatus 130 to dispose the planned dividing line 23 of the wafer 2 to the irradiation position of the laser beam LB emitted from the laser beam irradiation unit 110. The control means 700 controls the table moving apparatus 130 to move the chuck table 120 relative to the laser beam LB.

In the modified-layer forming step, the laser beam irradiation unit 110 emits the laser beam LB having such a wavelength as to be transmitted through the wafer 2. The wafer 2 is irradiated with the laser beam LB from the side of the back surface 2B of the wafer 2 along the planned dividing line 23. Thereby, the modified layer 24 is formed inside the wafer 2 along the planned dividing line 23.

Next, the seventh conveyance step (S25) will be described. The control means 700 outputs, to the conveying unit 600, a control signal for conveying the wafer 2 from the laser processing apparatus 100 to the tape sticking apparatus 300. The wafer 2 in which the modified layers 24 have been formed and that has been unloaded from the chuck table 120 is unloaded from the laser processing apparatus 100 by the conveying unit 610A of the conveying unit 600 and is conveyed to the tape sticking apparatus 300. The conveying unit 610A holds the back surface 2B of the wafer 2 by suction by the suction pad 612A and unloads the wafer 2 in the first state from the laser processing apparatus 100 to convey the wafer 2 to the tape sticking apparatus 300.

Next, the shift-sticking step (S26) will be described. The control means 700 outputs, to the frame-unit forming means 310 of the tape sticking apparatus 300, a control signal for sticking the dicing tape 7 to the back surface 2B of the wafer 2 ground by the grinding apparatus 200 and fixing the annular frame 8 to the outer circumferential edge of the dicing tape 7. Furthermore, the control means 700 outputs a control signal for separating the protective tape 3 stuck to the front surface 2A of the wafer 2 to the separating means 320 of the tape sticking apparatus 300. Due to this, similarly to the above-described shift-sticking step S16, in the tape sticking apparatus 300, the wafer 2 in the third state in which the dicing tape 7 supported by the annular frame 8 is stuck to the back surface 2B and the protective tape 3 has been separated from the front surface 2A is generated.

Next, the eighth conveyance step (S27) will be described. The control means 700 outputs, to the conveying unit 600, a control signal for conveying the wafer 2 from the tape sticking apparatus 300 to the second cassette 510. Similarly to the above-described fourth conveyance step S17, the wafer 2 in the third state is unloaded from the tape sticking apparatus 300 and is conveyed to the second cassette 510. The frame unit 9 including the wafer 2 in the third state is placed at the unloading provisional placement part 350. Then, the frame unit 9 is slid and inserted into the second cassette 510 while being guided by a guide rail, and is housed therein.

(Method for Processing Wafer Housed in Second Cassette)

Figure 16:
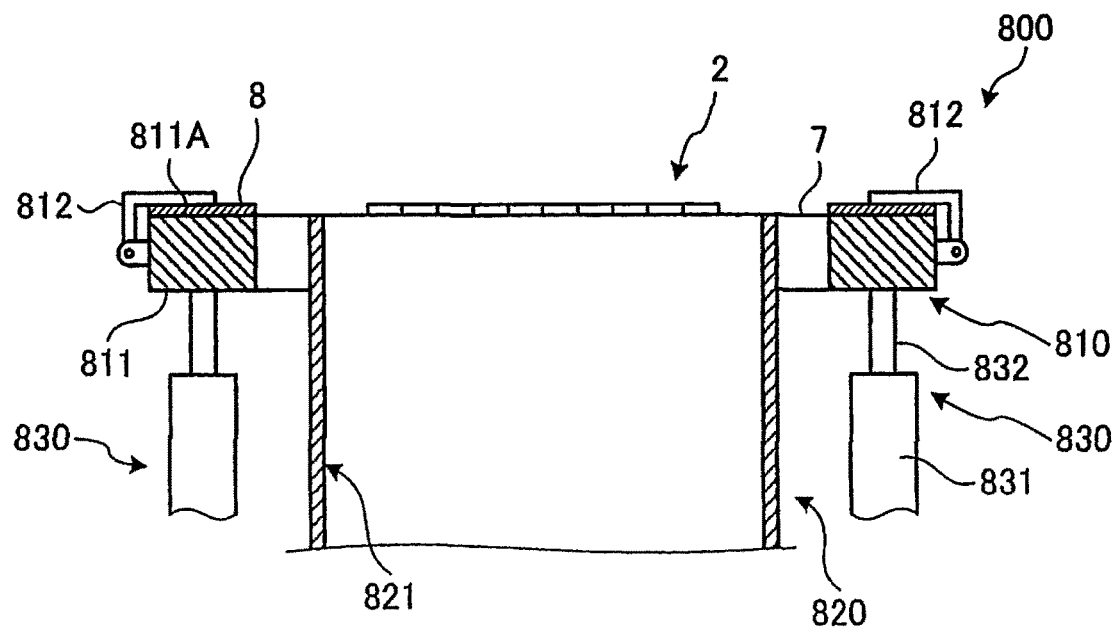
FIG. 16 is a diagram schematically showing operation of a dividing apparatus used for a dividing step according to the embodiment.
Figure 17:
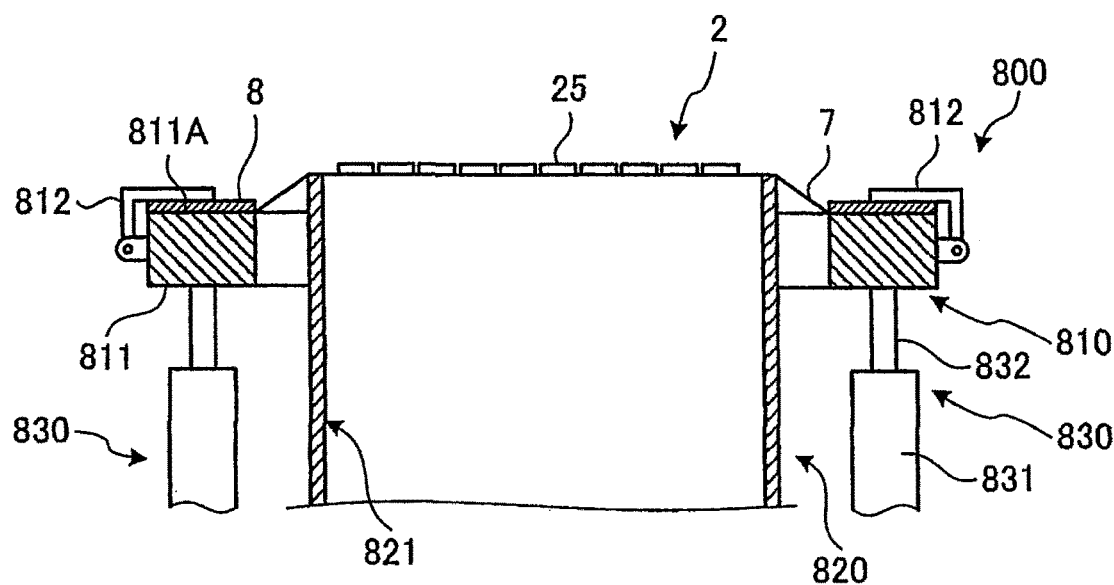
FIG. 17 is a diagram schematically showing the operation of the dividing apparatus used for the dividing step according to the embodiment.

As described above, by the method for processing the wafer 2 based on at least one of the first processing program and the second processing program, the wafer 2 in the third state is housed in the second cassette 510. The wafer 2 that has been thinned and in which the modified layers 24 have been formed is divided into plural device chips in a dividing step. FIG. 16 and FIG. 17 are diagrams schematically showing operation of dividing apparatus 800 used for the dividing step according to the present embodiment.

The wafer 2 in the third state unloaded from the second cassette 510 is set in the dividing apparatus 800. As shown in FIG. 16, the dividing apparatus 800 includes frame holding means 810 that holds the annular frame 8 and tape expanding means 820 that expands the dicing tape 7 mounted to the annular frame 8 held by the frame holding means 810. The frame holding means 810 has a frame holding member 811 having an annular shape and plural clamp mechanisms 812 disposed at the outer circumference of the frame holding member 811. The upper surface of the frame holding member 811 is a placement surface 811A on which the annular frame 8 is placed. The annular frame 8 placed on the placement surface 811A is fixed to the frame holding member 811 by the clamp mechanisms 812. The frame holding means 810 can move in the upward-downward direction by the tape expanding means 820.

The tape expanding means 820 has an expanding drum 821 disposed inside the frame holding member 811. The expanding drum 821 has an inner diameter and an outer diameter that are smaller than the inner diameter of the annular frame 8 and are larger than the outer diameter of the wafer 2. The tape expanding means 820 has support means 830 that can move the frame holding member 811 in the upward-downward direction. The support means 830 has plural air cylinders 831. Piston rods 832 of the air cylinders 831 are joined to the lower surface of the frame holding member 811. The support means 830 including the plural air cylinders 831 moves the frame holding member 811 in such a manner that the placement surface 811A of the frame holding member 811 moves in the upward-downward direction between a reference position at substantially the same height as the upper end of the expanding drum 821 and an expansion position closer to the lower side than the upper end of the expanding drum 821 by a predetermined amount.

Next, the dividing step using the dividing apparatus 800 will be described. The wafer 2 in which the modified layers 24 have been formed along the planned dividing lines 23 is supported by the dicing tape 7. As shown in FIG. 16, the annular frame 8 that supports the wafer 2 through the dicing tape 7 is placed on the placement surface 811A of the frame holding member 811 of the frame holding means 810 and is fixed to the frame holding member 811 by the clamp mechanisms 812. At this time, the frame holding member 811 is positioned at the reference position shown in FIG. 16.

Next, the plural air cylinders 831 of the support means 830 are actuated and the frame holding member 811 is lowered to the expansion position shown in FIG. 17. Due to this, the annular frame 8 fixed to the placement surface 811A of the frame holding member 811 also descends. Thus, as shown in FIG. 17, the dicing tape 7 mounted to the annular frame 8 abuts against the upper end part of the expanding drum 821 and expands. As a result, a tensile force in a radial manner acts on the wafer 2 stuck to the dicing tape 7. When the tensile force in a radial manner acts on the wafer 2, the substrate 20 of the wafer 2 is divided along the planned dividing lines 23, with the modified layers 24 formed along the planned dividing lines 23 serving as the origin of the breaking. Thereby, the wafer 2 is divided into plural device chips 25.

(Method for Processing Wafer Based on Third Processing Program and Fourth Processing Program)

Figure 18:
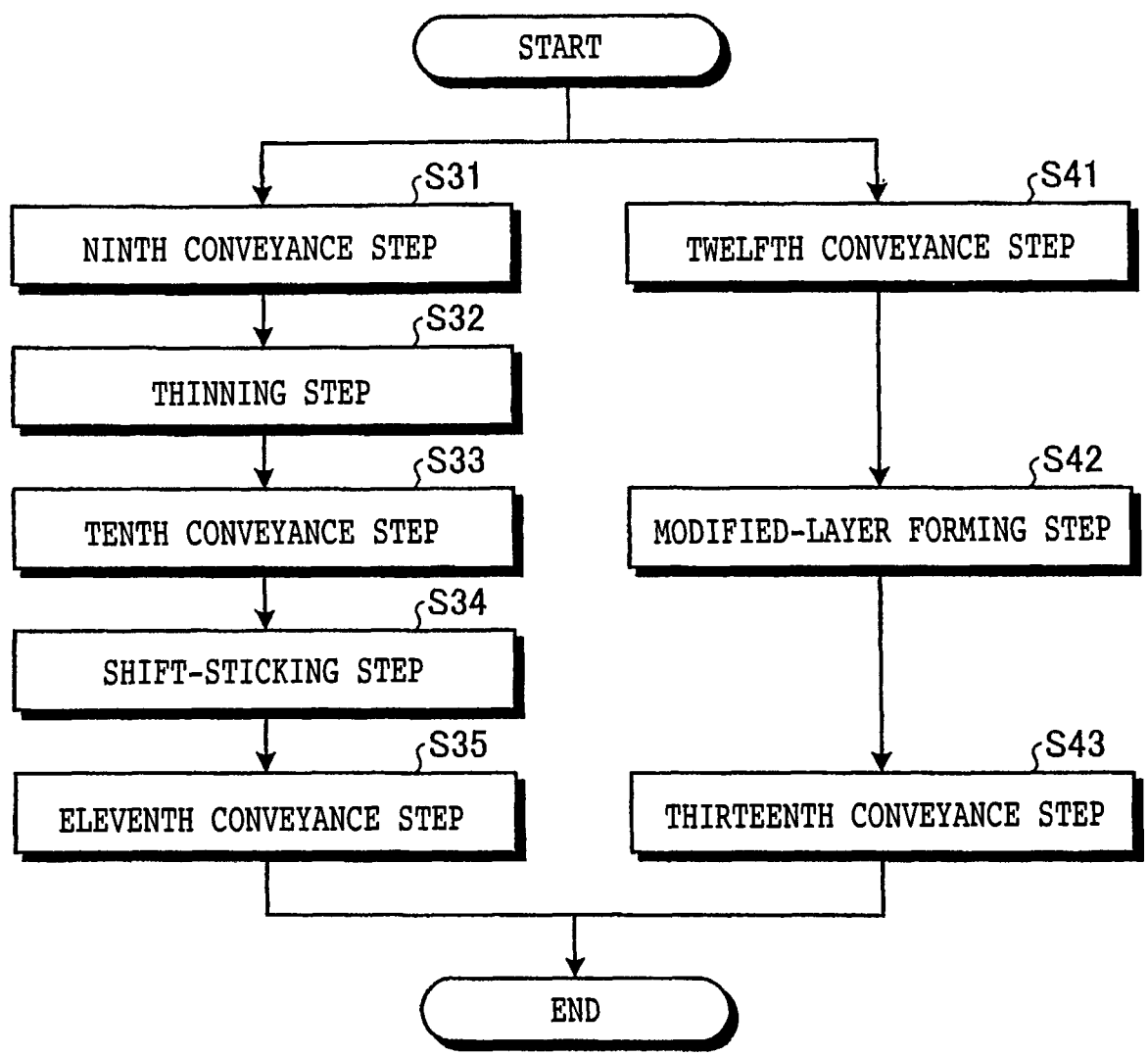
FIG. 18 is a flowchart showing one example of a method for processing the wafer based on a third processing program and a fourth processing program according to the embodiment.

Next, a method for processing the wafer 2 based on the third processing program and the fourth processing program will be described. FIG. 18 is a flowchart showing one example of the method for processing the wafer 2 based on the third processing program and the fourth processing program according to the present embodiment.

As shown in FIG. 18, the method for processing the wafer 2 based on the third processing program includes the following steps: a ninth conveyance step (S31) of conveying the wafer 2 in the first state unloaded from the first cassette 410 to the grinding apparatus 200; a thinning step (S32) of thinning the wafer 2 by grinding the back surface 2B of the wafer 2 conveyed to the grinding apparatus 200; a tenth conveyance step (S33) of conveying the thinned wafer 2 to the tape sticking apparatus 300; a shift-sticking step (S34) of sticking the dicing tape 7 to the back surface 2B of the wafer 2 conveyed to the tape sticking apparatus 300 and fixing the annular frame 8 to the outer circumferential edge of the dicing tape 7 to form the frame unit 9 and then separating the protective tape 3 stuck to the front surface 2A of the wafer 2; and an eleventh conveyance step (S35) of conveying the wafer 2 in the third state generated in the tape sticking apparatus 300 to the second cassette 510.

Furthermore, as shown in FIG. 18, the method for processing the wafer 2 based on the fourth processing program includes a twelfth conveyance step (S41) of conveying the wafer 2 in the second state unloaded from the second cassette 510 to the laser processing apparatus 100, a modified-layer forming step (S42) of forming modified layers inside the wafer 2 along the planned dividing lines 23 by irradiating the wafer 2 conveyed to the laser processing apparatus 100 with a laser beam, and a thirteenth conveyance step (S43) of conveying the wafer 2 in the second state in which the modified layers have been formed to the second cassette 510. The method for processing the wafer 2 based on the third processing program and the method for processing the wafer 2 based on the fourth processing program are concurrently executed.

The ninth conveyance step (S31) will be described. The control means 700 outputs, to the conveying unit 600, a control signal for unloading the wafer 2 in the first state from the first cassette 410 and conveying the wafer 2 to the grinding apparatus 200. Similarly to the above-described first conveyance step S11, the wafer 2 in the first state is unloaded from the first cassette 410 by the conveying unit 610B in the ninth conveyance step S31. The conveying unit 610B holds the back surface 2B of the wafer 2 by suction by the suction pad 612B and unloads the wafer 2 in the first state from the first cassette 410 to convey the wafer 2 to the grinding apparatus 200.

Next, the thinning step (S32) will be described. The control means 700 outputs a control signal for grinding the back surface of the wafer 2 to thin the wafer 2 to the grinding apparatus 200. The wafer 2 in the first state is held by the chuck table 220 of the grinding apparatus 200. The chuck table 220 holds the wafer 2 with the intermediary of the protective tape 3 in such a manner that the back surface 2B of the wafer 2 is oriented upward. The back surface 2B of the wafer 2 is ground by the grinding unit 210 and thereby the wafer 2 is thinned.

Next, the tenth conveyance step (S33) will be described. The control means 700 outputs, to the conveying unit 600, a control signal for conveying the wafer 2 from the grinding apparatus 200 to the tape sticking apparatus 300. The thinned wafer 2 is unloaded from the chuck table 220. The wafer 2 unloaded from the chuck table 220 is unloaded from the grinding apparatus 200 by the conveying unit 610A of the conveying unit 600 and is conveyed to the tape sticking apparatus 300. The conveying unit 610A holds the back surface 2B of the wafer 2 under suction by the suction pad 612A and unloads the wafer 2 in the first state from the grinding apparatus 200 to convey the wafer 2 to the tape sticking apparatus 300.

Next, the shift-sticking step (S34) will be described. The control means 700 outputs, to the frame-unit forming means 310 of the tape sticking apparatus 300, a control signal for sticking the dicing tape 7 to the back surface 2B of the wafer 2 ground by the grinding apparatus 200 and fixing the annular frame 8 to the outer circumferential edge of the dicing tape 7. Furthermore, the control means 700 outputs a control signal for separating the protective tape 3 stuck to the front surface 2A of the wafer 2 to the separating means 320 of the tape sticking apparatus 300. Due to this, in the tape sticking apparatus 300, the wafer 2 in the third state in which the dicing tape 7 supported by the annular frame 8 is stuck to the back surface 2B and the protective tape 3 has been separated from the front surface 2A is generated.

Next, the eleventh conveyance step (S35) will be described. The control means 700 outputs, to the conveying unit 600, a control signal for conveying the wafer 2 from the tape sticking apparatus 300 to the second cassette 510. The wafer 2 in the third state is unloaded from the tape sticking apparatus 300 and is conveyed to the second cassette 510. The frame unit 9 including the wafer 2 in the third state is placed at the unloading provisional placement part 350. Then, the frame unit 9 is slid and inserted into the second cassette 510 while being guided by a guide rail, and is housed therein.

In the third processing program, the wafer 2 in the third state that has been thinned by the grinding apparatus 200 but for which the forming of the modified layers 24 by the laser processing apparatus 100 has not been carried out is housed in the second cassette 510.

Next, the twelfth conveyance step (S41) will be described. In the second cassette 510, the wafer 2 in the second state in which the dicing tape 4 is stuck to the front surface 2A like that described with reference to FIG. 6 is also housed. The control means 700 outputs, to the conveying unit 600, a control signal for unloading the wafer 2 in the second state from the second cassette 510 and conveying the wafer 2 to the laser processing apparatus 100. In the twelfth conveyance step S41, the wafer 2 in the second state is unloaded from the second cassette 510 by the conveying unit 620. The conveying unit 620 holds the annular frame 5 of the frame unit 6 by the holding hand 622 and unloads the wafer 2 in the second state from the second cassette 510 to convey the wafer 2 to the laser processing apparatus 100.

Figure 19:
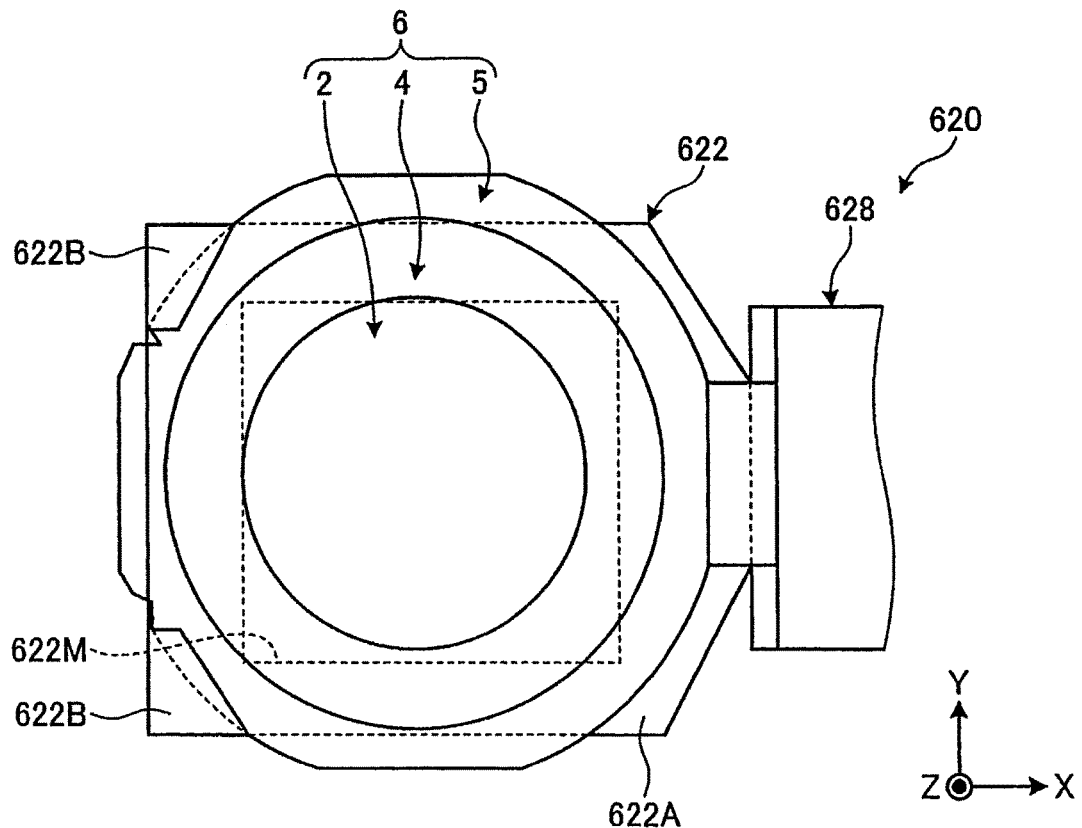
FIG. 19 is a diagram schematically showing one example of a twelfth conveyance step according to the embodiment.
Figure 20:
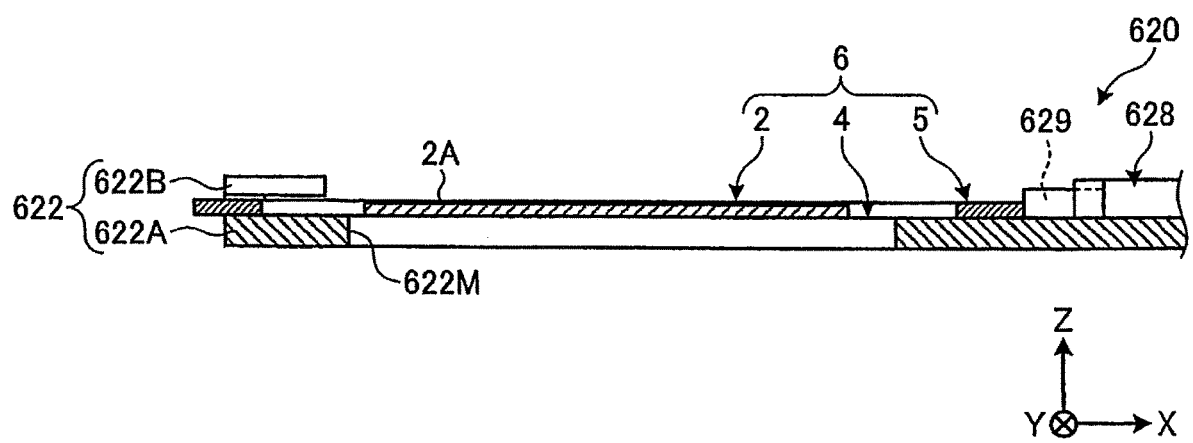
FIG. 20 is a diagram schematically showing the one example of the twelfth conveyance step according to the embodiment.

FIG. 19 and FIG. 20 are diagrams schematically showing one example of the twelfth conveyance step according to the present embodiment. FIG. 19 is a plan view showing the state in which the frame unit 6 is being conveyed by the conveying unit 620. FIG. 20 is a side sectional view showing the state in which the frame unit 6 is being conveyed by the conveying unit 620. As shown in FIG. 19 and FIG. 20, the holding hand 622 of the conveying unit 620 has the support member 622A that supports the annular frame 5 of the frame unit 6. The support member 622A is a flat-plate-shaped member formed of ceramic for example. An opening 622M is made at the central part of the support member 622A. Reduction in the weight of the holding hand 622 is intended by the opening 622M.

The two engagement parts 622B that engage an end part of the annular frame 5 are disposed at the tip part of the one-side surface of the support member 622A with which the frame unit 6 gets contact. A gap in which at least part of the annular frame 5 is inserted is made between the support member 622A and the engagement parts 622B. Due to the insertion of at least part of the annular frame 5 in the gap between the support member 622A and the engagement parts 622B, the frame unit 6 is held by the holding hand 622.

On the base end part side of the one-side surface of the support member 622A, a pressing mechanism 628 that presses the outer circumferential edge of the annular frame 5 to position the frame unit 6 to a predetermined position is provided. The pressing mechanism 628 has a pressing member 629 that can get contact with the annular frame 8. The pressing member 629 can move between a fixing position at which the pressing member 629 gets contact with the annular frame 5 and presses the annular frame 8 against the engagement parts 622B and a releasing position at which the pressing member 629 is separated from the annular frame 5 to release the fixing of the annular frame 8.

The frame unit 6 including the wafer 2 in the second state is unloaded from the second cassette 510 by the conveying unit 620 and is conveyed to the provisional placement part 140 of the laser processing apparatus 100.

In the present embodiment, the back surface 2B of the wafer 2 in the second state conveyed from the second cassette 510 to the laser processing apparatus 100 has been already ground and this wafer 2 has been thinned. The wafer 2 in the second state conveyed from the second cassette 510 to the laser processing apparatus 100 does not need to have been thinned.

Figure 21:
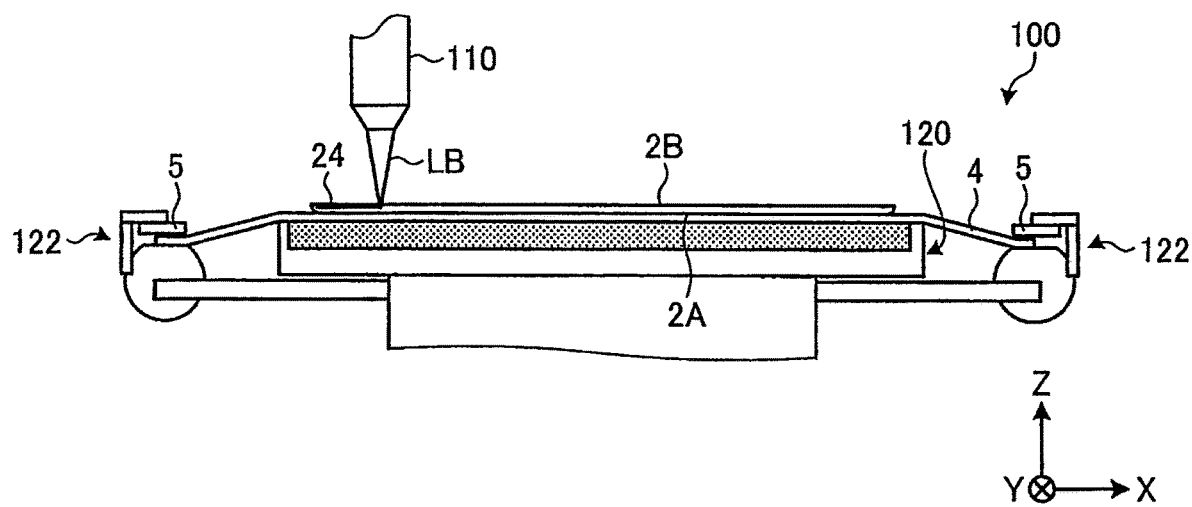
FIG. 21 is a diagram schematically showing one example of a modified-layer forming step according to the embodiment.

Next, the modified-layer forming step (S42) will be described. FIG. 21 is a diagram schematically showing one example of the modified-layer forming step according to the present embodiment. The control means 700 outputs a control signal for forming the modified layers 24 in the wafer 2 to the laser processing apparatus 100. As shown in FIG. 21, the wafer 2 in the second state is held by the chuck table 120 of the laser processing apparatus 100. The chuck table 120 holds the wafer 2 with the intermediary of the dicing tape 4. The chuck table 120 holds the wafer 2 in such a manner that the dicing tape 4 is opposed to the holding surface of the chuck table 120 and the back surface 2B of the wafer 2 is oriented upward. The chuck table 120 holds the wafer 2 by suction through the dicing tape 4. The annular frame 5 is held by the clamp mechanism 122 disposed around the holding surface of the chuck table 120.

After the wafer 2 in the second state is held by the chuck table 120, the control means 700 controls the table moving apparatus 130 to dispose the planned dividing line 23 of the wafer 2 to the irradiation position of the laser beam LB emitted from the laser beam irradiation unit 110. The control means 700 controls the table moving apparatus 130 to move the chuck table 120 relative to the laser beam LB. The wafer 2 is irradiated with the laser beam LB emitted from the laser beam irradiation unit 110 from the side of the back surface 2B of the wafer 2 along the planned dividing line 23. Thereby, the modified layer 24 is formed inside the wafer 2 along the planned dividing line 23.

Next, the thirteenth conveyance step (S43) will be described. The control means 700 outputs, to the conveying unit 600, a control signal for conveying the wafer 2 in the second state from the laser processing apparatus 100 to the second cassette 510. The wafer 2 in the second state in which the modified layers 24 have been formed and that has been unloaded from the chuck table 120 is unloaded from the laser processing apparatus 100 by the conveying unit 620 of the conveying unit 600 and is conveyed to the second cassette 510. The conveying unit 620 holds the annular frame 5 by the holding hand 622 and unloads the wafer 2 in the second state from the laser processing apparatus 100 to convey the wafer 2 to the second cassette 510.

In the twelfth conveyance step (S41) in the method for processing the wafer 2 based on the fourth processing program, the wafer 2 in the first state may be unloaded from the first cassette 410 by the conveying unit 610B and be conveyed to the laser processing apparatus 100, and then the modified layers 24 may be formed. Furthermore, in the thirteenth conveyance step (S43), the wafer 2 in the first state in which the modified layers 24 have been formed by the modified-layer forming step (S42) may be unloaded from the laser processing apparatus 100 by the conveying unit 610B and be conveyed to the second cassette 510.

[Operation and Effects]

As described above, according to the present embodiment, the laser processing apparatus 100, the grinding apparatus 200, and the tape sticking apparatus 300 are integrated by the common conveying unit 600 and the wafers 2 can be conveyed among the laser processing apparatus 100, the grinding apparatus 200, the tape sticking apparatus 300, the first cassettes 410, and the second cassettes 510 without using a cassette. Therefore, breaking of the wafer 2 in the conveyance of the wafer 2 is suppressed. Furthermore, the wafer 2 can be conveyed in accordance with the program registered in advance without using a cassette. Therefore, in the case of loading the wafer 2 into either one apparatus of the laser processing apparatus 100, the grinding apparatus 200, and the tape sticking apparatus 300, loading the wafer 2 into different apparatus accidentally is suppressed.

Furthermore, according to the present embodiment, the wafer processing system 1 can carry out both programs of the first processing program and the second processing program. Thus, with suppression of breaking of the wafer 2, the wafer 2 can be processed with high versatility.

Moreover, according to the present embodiment, the wafer processing system 1 can concurrently execute the third processing program, in which the grinding apparatus 200 and the tape sticking apparatus 300 are used, and the fourth processing program, in which the laser processing apparatus 100 is used. Due to this, the lowering of the utilization rate of each of the laser processing apparatus 100, the grinding apparatus 200, and the tape sticking apparatus 300 is suppressed and each of the laser processing apparatus 100, the grinding apparatus 200, and the tape sticking apparatus 300 is effectively utilized.

The present invention is not limited to the above-described embodiment. That is, the present invention can be carried out with various modifications without departing from the gist of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing system that executes processing for a wafer having a front surface on which a device is formed in each of a plurality of regions partitioned by a plurality of planned dividing lines that intersect, the wafer processing system comprising:
   a laser processing apparatus including a laser beam irradiation unit with a laser oscillator that generates a laser beam and irradiates the wafer with the laser beam to form modified layers inside the wafer along the planned dividing lines;
   a grinding apparatus including a grinding unit that grinds a back surface of the wafer to thin the wafer;

a tape sticking apparatus including frame-unit forming means for sticking a dicing tape to the back surface of the wafer ground by the grinding apparatus and fixing an annular frame to an outer circumferential edge of the dicing tape and separating means for separating a protective tape stuck to the front surface of the wafer;

a first cassette placement part at which a first cassette that houses a plurality of wafers each having the front surface to which the protective tape is stuck is placed;

a second cassette placement part at which a second cassette that houses a plurality of wafers each supported in an opening of the annular frame by the dicing tape is placed;

a conveying unit that conveys the wafer among the laser processing apparatus, the grinding apparatus, the tape sticking apparatus, the first cassette, and the second cassette; and control means for controlling the laser processing apparatus, the grinding apparatus, the tape sticking apparatus, and the conveying unit, wherein the control means includes:

a first processing program instructing section configured to output a control signal for conveying the wafer unloaded from the first cassette to the laser processing apparatus, the grinding apparatus, the tape sticking apparatus, and the second cassette and sequentially carrying out processing by the laser processing apparatus, the grinding apparatus, the tape sticking apparatus and the second cassette on the wafer, and a second processing program instructing section configured to output a control signal for conveying the wafer unloaded from the first cassette to the grinding apparatus, the laser processing apparatus, the tape sticking apparatus, and the second cassette and sequentially carrying out processing by the grinding apparatus, the laser processing apparatus, the tape sticking apparatus and the second cassette on the wafer.

2. The wafer processing system according to claim 1, wherein the control means further includes;

a third processing program instructing section configured to output a control signal for conveying the wafer unloaded from the first cassette to the grinding apparatus and the tape sticking apparatus and carrying out processing by the grinding apparatus and the tape sticking apparatus on the wafer, and a fourth processing program instructing section configured to output a control signal for conveying the wafer unloaded from the first cassette or the second cassette, to the laser processing apparatus and carrying out processing by the laser processing apparatus for the wafer, wherein the third processing program and the fourth processing program are concurrently executed.

3. The wafer processing system according to claim 1, wherein the wafer conveying unit includes a first conveying apparatus having an arm that holds the wafer and conveys the wafer between a provisional placement part and a position adjustment unit in the grinding apparatus.

4. The wafer processing system according to claim 3, wherein the wafer conveying unit includes a second conveying apparatus having an arm that holds the wafer and conveys the wafer to a cleaning unit.

5. The wafer processing system according to claim 1, wherein the first processing program instructing section includes a modified-layer forming step in which the laser processing apparatus forms a modified layer inside the wafer with the laser beam.

6. The wafer processing system according to claim 1, wherein the second processing program instructing section includes a modified-layer forming step in which the laser processing apparatus forms a modified layer inside the wafer with the laser beam.

7. The wafer processing system according to claim 2, wherein the fourth processing program instructing section includes a modified-layer forming step in which the laser processing apparatus forms a modified layer inside the wafer with the laser beam.

* * * * *